(12) United States Patent
Bhattacharyya

(10) Patent No.: US 10,374,101 B2
(45) Date of Patent: Aug. 6, 2019

(54) MEMORY ARRAYS

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/641,704

(22) Filed: Jul. 5, 2017

(65) Prior Publication Data

US 2019/0013415 A1    Jan. 10, 2019

(51) Int. Cl.
| | |
|---|---|
| *H01L 29/792* | (2006.01) |
| *H01L 27/1157* | (2017.01) |
| *H01L 21/28* | (2006.01) |
| *H01L 29/66* | (2006.01) |
| *G11C 17/12* | (2006.01) |
| *G11C 16/04* | (2006.01) |
| *G11C 16/16* | (2006.01) |

(52) U.S. Cl.
CPC ...... *H01L 29/7923* (2013.01); *G11C 16/0475* (2013.01); *G11C 16/16* (2013.01); *G11C 17/123* (2013.01); *H01L 21/28282* (2013.01); *H01L 27/1157* (2013.01); *H01L 29/66833* (2013.01)

(58) Field of Classification Search
CPC ........... H01L 29/7923; H01L 29/66833; H01L 27/1157; H01L 21/28282; H01L 29/42324; H01L 27/11568; H01L 29/4234; H01L 27/11521; G11C 17/123

USPC .................................................. 257/316, 326
See application file for complete search history.

(56) References Cited

U.S. PATENT DOCUMENTS

| | | | |
|---|---|---|---|
| 4,870,470 A | 9/1989 | Bass et al. | |
| 6,388,293 B1 * | 5/2002 | Ogura ................ | G11C 16/0466 257/324 |
| 6,709,928 B1 * | 3/2004 | Jenne .................... | H01L 27/115 257/E21.679 |
| 6,743,681 B2 | 6/2004 | Bhattacharyya | |
| 6,743,682 B2 | 6/2004 | Woerlee et al. | |
| 6,888,200 B2 | 5/2005 | Bhattacharyya | |
| 6,903,969 B2 | 6/2005 | Bhattacharyya | |
| 6,917,078 B2 | 7/2005 | Bhattacharyya | |
| 6,998,667 B2 | 2/2006 | Bhattacharyya | |
| 7,012,297 B2 | 3/2006 | Bhattacharyya | |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Marc Anthony Armand
*Assistant Examiner* — Sue Tang
(74) *Attorney, Agent, or Firm* — Brooks, Cameron & Huebsch, PLLC

(57) ABSTRACT

In an example, a memory array may include a memory cell around at least a portion of a semiconductor. The memory cell may include a gate, a first dielectric stack to store a charge between a first portion of the gate and the semiconductor, and a second dielectric stack to store a charge between a second portion of the gate and the semiconductor, the second dielectric stack separate from the first dielectric stack.

14 Claims, 12 Drawing Sheets

(56) References Cited

U.S. PATENT DOCUMENTS

| | | |
|---|---|---|
| 7,042,027 B2 | 5/2006 | Bhattacharyya |
| 7,130,216 B2 | 10/2006 | Bhattacharyya |
| 7,145,186 B2 | 12/2006 | Bhattacharyya |
| 7,158,410 B2 | 1/2007 | Bhattacharyya et al. |
| 7,166,888 B2 | 1/2007 | Bhattacharyya |
| 7,184,312 B2 | 2/2007 | Bhattacharyya |
| 7,208,793 B2 | 4/2007 | Bhattacharyya |
| 7,224,002 B2 | 5/2007 | Bhattacharyya |
| 7,244,981 B2 | 7/2007 | Bhattacharyya |
| 7,250,628 B2 | 7/2007 | Bhattacharyya |
| 7,273,784 B2 | 9/2007 | Bhattacharyya |
| 7,276,760 B2 | 10/2007 | Bhattacharyya |
| 7,279,740 B2 | 10/2007 | Bhattacharyya et al. |
| 7,339,239 B2 | 3/2008 | Forbes |
| 7,339,830 B2 | 3/2008 | Bhattacharyya |
| 7,349,252 B2 | 3/2008 | Bhattacharyya et al. |
| 7,365,388 B2 | 4/2008 | Bhattacharyya |
| 7,379,336 B2 | 5/2008 | Bhattacharyya et al. |
| 7,385,245 B2 | 6/2008 | Bhattacharyya |
| 7,400,012 B2 | 7/2008 | Bhattacharyya |
| 7,403,416 B2 | 7/2008 | Bhattacharyya et al. |
| 7,417,893 B2 | 8/2008 | Bhattacharyya et al. |
| 7,429,767 B2 | 9/2008 | Bhattacharyya |
| 7,432,562 B2 | 10/2008 | Bhattacharyya |
| 7,436,018 B2 | 10/2008 | Bhattacharyya |
| 7,440,310 B2 | 10/2008 | Bhattacharyya |
| 7,440,317 B2 | 10/2008 | Bhattacharyya |
| 7,456,054 B2 | 11/2008 | Bhattacharyya |
| 7,457,159 B2 | 11/2008 | Bhattacharyya et al. |
| 7,459,740 B2 | 12/2008 | Bhattacharyya et al. |
| 7,476,927 B2 | 1/2009 | Bhattacharyya |
| 7,482,651 B2 | 1/2009 | Bhattacharyya |
| 7,485,513 B2 | 2/2009 | Bhattacharyya |
| 7,525,149 B2 | 4/2009 | Bhattacharyya et al. |
| 7,528,043 B2 | 5/2009 | Bhattacharyya |
| 7,544,990 B2 | 6/2009 | Bhattacharyya |
| 7,553,735 B2 | 6/2009 | Bhattacharyya |
| 7,579,242 B2 | 8/2009 | Bhattacharyya |
| 7,612,403 B2 | 11/2009 | Bhattacharyya |
| 7,625,803 B2 | 12/2009 | Bhattacharyya |
| 7,629,641 B2 | 12/2009 | Bhattacharyya |
| 7,662,693 B2 | 2/2010 | Bhattacharyya |
| 7,671,407 B2 | 3/2010 | Bhattacharyya |
| 7,728,350 B2 | 6/2010 | Bhattacharyya |
| 7,749,848 B2 | 7/2010 | Bhattacharyya et al. |
| 7,750,395 B2 | 7/2010 | Bhattacharyya |
| 7,759,715 B2 | 7/2010 | Bhattacharyya |
| 7,768,062 B2 | 8/2010 | Bhattacharyya et al. |
| 7,786,516 B2 | 8/2010 | Bhattacharyya |
| 7,838,362 B2 | 11/2010 | Bhattacharyya |
| 7,851,827 B2 | 12/2010 | Bhattacharyya |
| 7,867,850 B2 | 1/2011 | Bhattacharyya |
| 7,898,022 B2 | 3/2011 | Bhattacharyya |
| 7,956,426 B2 | 6/2011 | Bhattacharyya |
| 7,964,909 B2 | 6/2011 | Bhattacharyya |
| 7,968,402 B2 | 6/2011 | Bhattacharyya |
| 8,058,118 B2 | 11/2011 | Bhattacharyya |
| 8,063,436 B2 | 11/2011 | Bhattacharyya |
| 8,125,003 B2 | 2/2012 | Bhattacharyya |
| 8,143,657 B2 | 3/2012 | Bhattacharyya |
| 8,159,875 B2 | 4/2012 | Bhattacharyya |
| 8,193,568 B2 | 6/2012 | Bhattacharyya |
| 8,228,743 B2 | 7/2012 | Min et al. |
| 8,242,554 B2 | 8/2012 | Bhattacharyya |
| 9,159,426 B1* | 10/2015 | D'Abreu ............ G11C 16/0483 |
| 2005/0133860 A1* | 6/2005 | Forbes ................. H01L 27/115 257/330 |
| 2007/0034922 A1 | 2/2007 | Bhattacharyya |
| 2008/0303080 A1 | 12/2008 | Bhattacharyya |
| 2010/0090265 A1 | 4/2010 | Bhattacharyya et al. |
| 2010/0120214 A1* | 5/2010 | Park ................. H01L 27/11578 438/287 |
| 2014/0273373 A1* | 9/2014 | Makala ............ H01L 27/11582 438/270 |
| 2015/0263016 A1* | 9/2015 | Cha .................... G11C 16/0483 257/314 |

OTHER PUBLICATIONS

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE

(56) References Cited

OTHER PUBLICATIONS

International Electron Devices Meeting (IEDM) 2000, Dec. 10-13, 2000, San Francisco, CA, pp. 645-648.
Lue et al., "A Novel P-Channel NAND-type Flash Memory with 2 bit/cell Operation and High Programming Throughput (> 20 Mb/sec)", IEEE International Electron Devices Meeting (IEDM) 2005, Dec. 5-7, 2005, Washington, D.C., 4 pages.
Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.
Luo et al., "Design of High Performance PFETs with Strained Si Channel and Laser Anneal", IEEE International Electron Devices Meeting (IEDM) 2005, Dec. 5-7, 2005, Washington D.C., pp. 495-498.
Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.
Manchanda et al., "Si-Doped Aluminates for High Temperature Metal-Gate CMOS: Zr-AlSi-O, a Novel Gate Dielectric for Low Power Applications", IEEE International Electron Devices Meeting (IEDM) 2000, Dec. 10-13, 2000, San Francisco, CA, pp. 23-26.
Mayuzumi et al., "Extreme High Performance n- and p-MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.
Moon et al., "Multi-Functional Universal Device using a Band-Engineered Vertical Structure", IEEE International Electron Devices Meeting (IEDM) 2011, Dec. 5-7, 2011, Washington D.C., pp. 551-554.
Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.
Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.
Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.
Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.
Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.
Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.
Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.
Taguchi, "NOR Flash Memory Technology", presented at 2006 IEEE International Electron Devices Meeting (IEDM) Short Course on Memory Technologies for 45nm and Beyond, Dec. 2006, 27 pages.
Wang et al., "Fast Erasing and Highly Reliable Monos Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.
Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.
Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.
Zhang et al., "Novel ZrO2/Si3N4 Dual Charge Storage Layer to Form Step-up Potential Wells for Highly Reliable Multi-level Cell Application", IEEE International Electron Devices Meeting (IEDM) 2007, Dec. 10-12, 2005, Washington D.C., pp. 83-86.
Likharev, "Riding the Crest of a New Wave in Memory", IEEE Circuits and Devices Magazine, vol. 16, Issue 4, Jul. 2000, pp. 16-21.
Ramaswamy et al., "Engineering a Planar NAND Cell Scalable to 20nm and Beyond", 2013 5th IEEE Memory Workshop, May 26-29, 2013, Monterey, CA, pp. 5-8.
Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

\* cited by examiner

MEMORY ARRAYS

TECHNICAL FIELD

The present disclosure relates generally to memory, and, more particularly, to memory arrays.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), or the like. Hard disc drives (HDDs) may be an example of another type of memory and may include magnetic tapes and/or optical discs.

Flash memory, may, for example, use one-transistor memory cells. Changes in threshold voltage of the cells, through programming (which is sometimes referred to as writing) of charge-storage structures (e.g., floating gates or charge traps) or other physical phenomena (e.g., phase change or polarization), may determine the data value of each cell.

In some examples, a NAND flash memory may include groups (e.g., strings) of series-coupled (e.g., one-transistor) non-volatile memory cells. The series-coupled memory cells in a string, for example, may be between a data line (e.g., a bit line) and a source. For example, the memory cells in a string may be coupled in series source to drain. Memory cells at specific locations in the strings, for example, may be commonly coupled to an access line, such as a word line.

Some NROMs, for example, may store a charge in a nitride, for example. The nitride, for example, might be part of an oxide-nitride-oxide (ONO) gate dielectric. In some examples, NROM cells may be n-channel field-effect transistors, such as n-FETs, where the gate dielectric may be replaced by an ONO stack.

DETAILED DESCRIPTION

Figure 1:
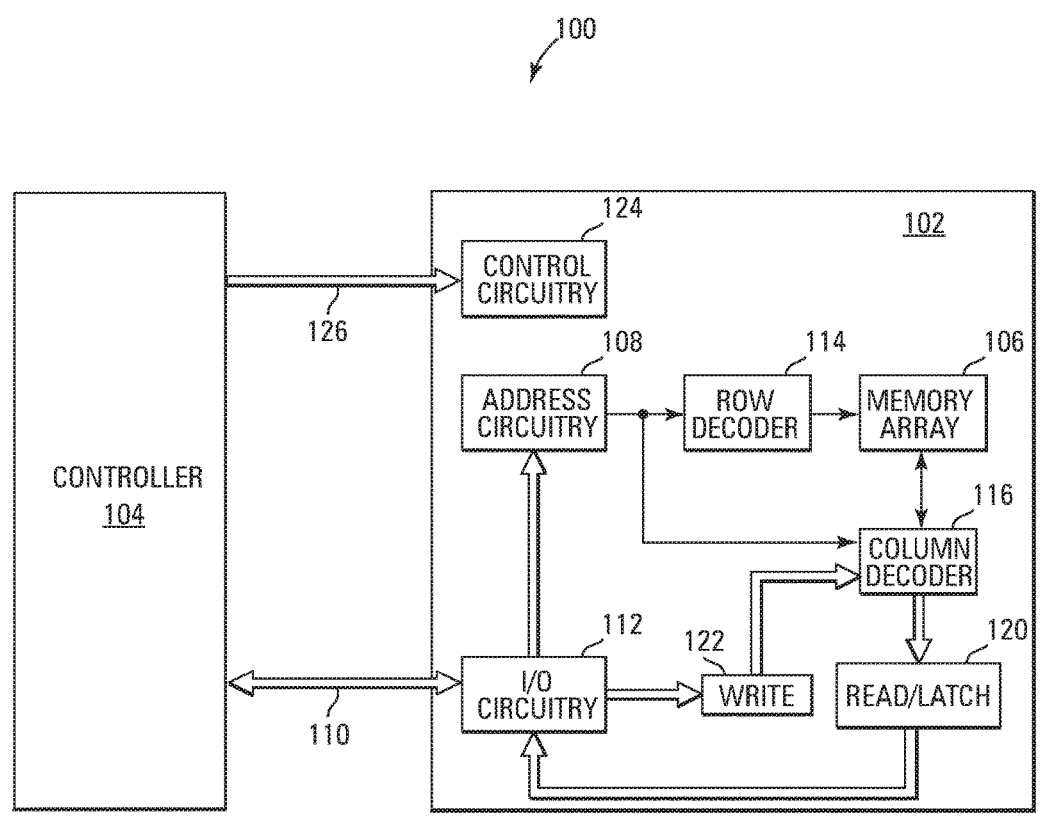
FIG. 1 is a block diagram that illustrates an example of an apparatus in accordance with a number of embodiments of the present disclosure.

In an example, a memory array may include a memory cell around at least a portion of a semiconductor. The memory cell may include a gate, a first dielectric stack to store a charge between a first portion of the gate and the semiconductor, and a second dielectric stack to store a charge between a second portion of the gate and the semiconductor, the second dielectric stack separate from the first dielectric stack.

Embodiments of the present disclosure may provide benefits, such as increased bit densities, such as compared to single-transistor memory cells, while possibly avoiding (e.g., eliminating) short-channel effects. When feature sizes, such as the channel length, of memory cells, are scaled, for example, to seek higher bit densities, short-channel effects may render the memory cells inoperable due not only to excessive and unacceptable device leakage, but also due to the inability to discriminate the memory states. By employing the memory cells presented in the examples herein and by employing, for example, a vertical channel implementation of such cells to provide channel length flexibility, feature sizes may be scaled down to the scalability limit (e.g., sub 10 nanometer dimension), reducing and/or avoiding the short channel effects. This may provide an increased bit density that may not be available using existing technology. The lowest data state, such as the erase state, of the memory cells in some embodiments may be more stable (e.g., with a smaller threshold-voltage range) than previous memory cells (e.g., the number of under and/or over erasures may be reduced compared to previous memory cells).

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a block diagram of an apparatus, such as an electronic memory system 100, in accordance with a number of embodiments of the present disclosure. Memory system 100 may include a memory device 102 and a controller 104, such as a memory controller (e.g., a host controller). Controller 104 might include a processor, for example. Controller 104 might be coupled to a host, for example, and may receive command signals (or commands), address signals (or addresses), and data signals (or data) from the host and may output data to the host.

Memory device 102 may include a memory array 106 of memory cells. For example, memory array 106 may include one or more of the memory arrays disclosed herein, such as one or more arrays of the memory cells disclosed herein. Memory array 106 may include, for example, NROM and/or NAND arrays.

Memory device 102 may include address circuitry 108 to latch address signals provided over I/O connections 110 through I/O circuitry 112. Address signals may be received and decoded by a row decoder 114 and a column decoder 116 to access the memory array 106.

Memory device 102 may read data in memory array 106 by sensing voltage and/or current changes in the memory array columns using sense/buffer circuitry that in some examples may be read/latch circuitry 120. Read/latch circuitry 120 may read and latch data from the memory array 106. I/O circuitry 112 may be included for bi-directional data communication over the I/O connections 110 with controller 104. Write circuitry 122 may be included to write data to memory array 106.

Control circuitry 124 may decode signals provided by control connections 126 from controller 104. These signals may include chip signals, write enable signals, and address latch signals that are used to control the operations on memory array 106, including data read, data write, and data erase operations.

Control circuitry 124 may be included in controller 104, for example. Controller 104 may include, other circuitry, firmware, software, or the like, whether alone or in combination. Controller 104 may be an external controller (e.g., in a separate die from the memory array 106, whether wholly or in part) or an internal controller (e.g., included in a same die as the memory array 106). For example, an internal controller might be a state machine or a memory sequencer.

It will be appreciated by those skilled in the art that additional circuitry and signals can be provided, and that the memory system 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Figure 2A:
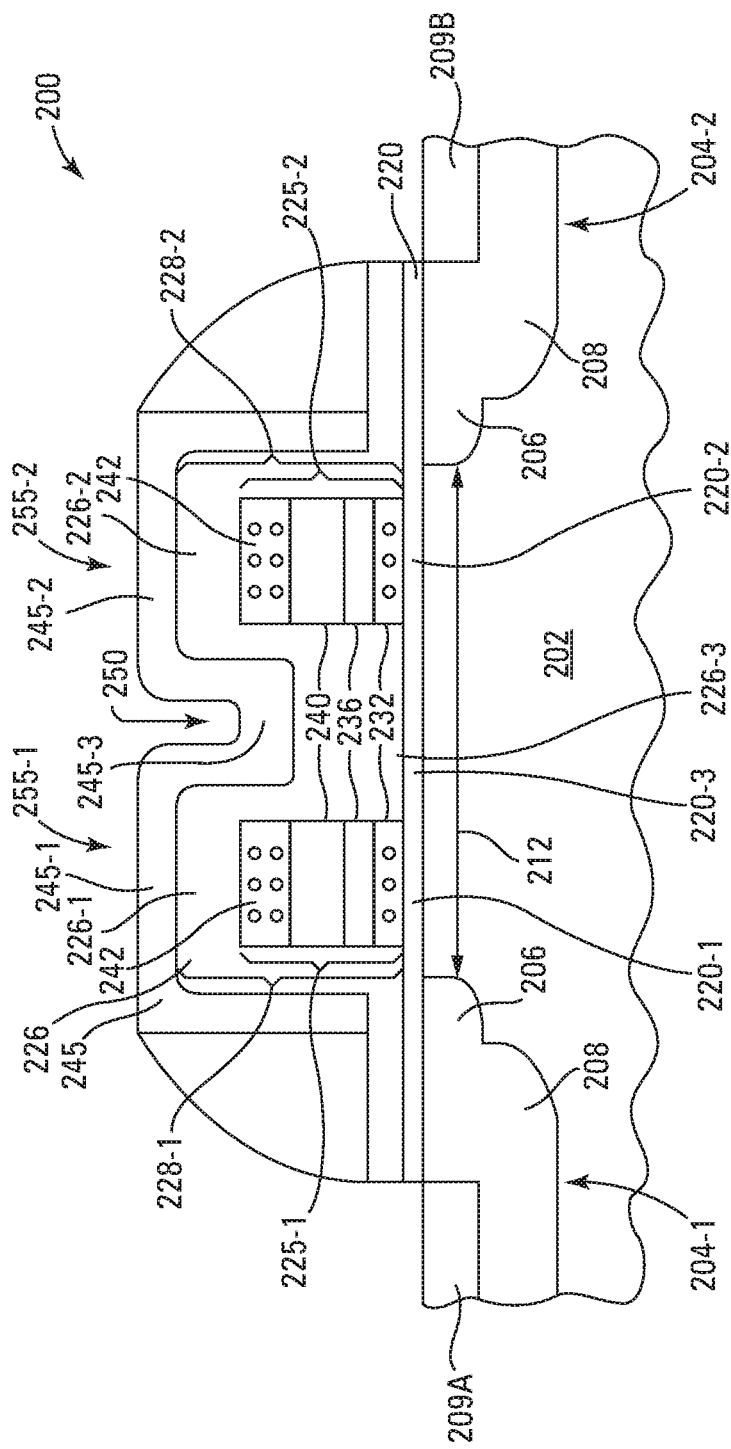
FIG. 2A is cross-sectional diagram of an example of a memory cell in accordance with a number of embodiments of the present disclosure.
Figure 2B:
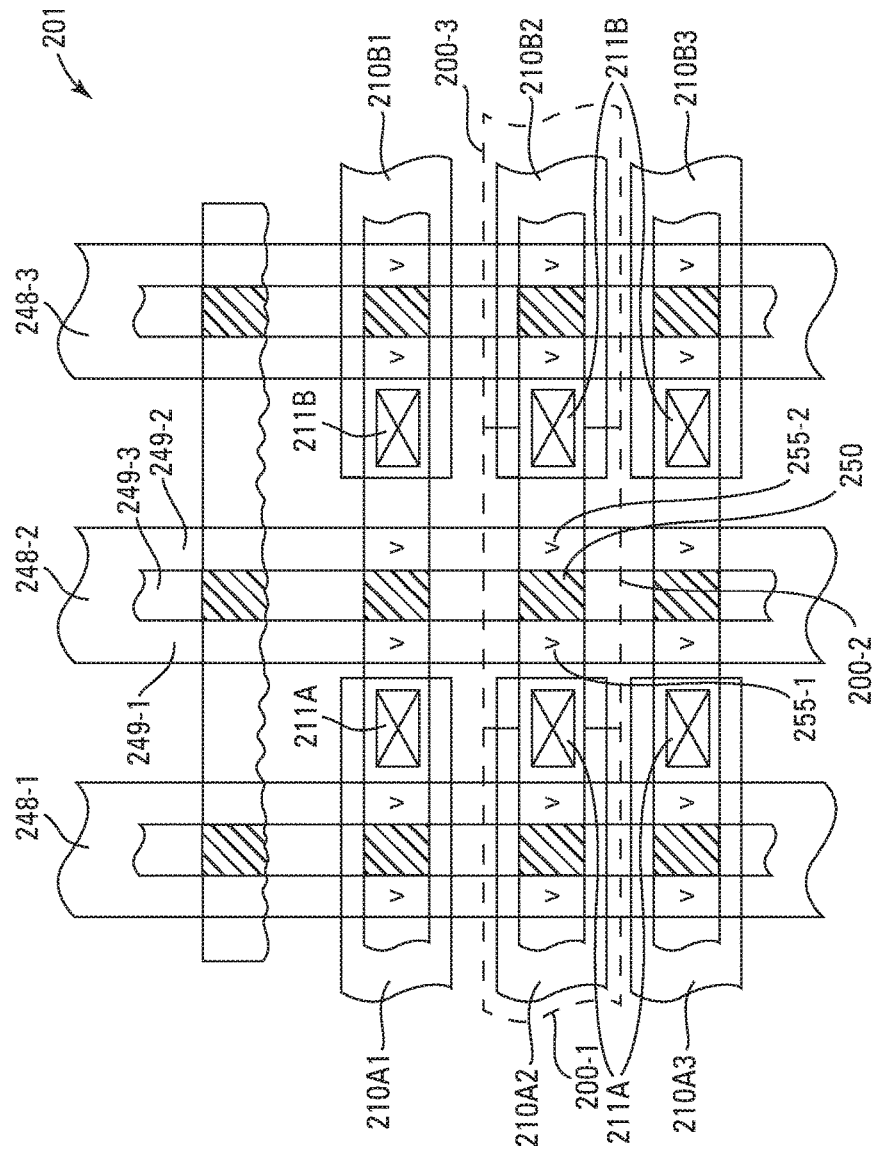
FIG. 2B is a top-down view of an example of a portion of a memory array in accordance with a number of embodiments of the present disclosure.

FIG. 2A is cross-sectional diagram of an example of a non-volatile memory cell 200, such as a split-gate memory cell (e.g., a split-gate NROM cell) in accordance with a number of embodiments of the present disclosure. For example, a memory cell 200 may be in a memory array that may be a portion of memory array 106. FIG. 2B is a top-down view of an example of a portion of a memory array 201 (e.g., that may be a portion of memory array 106) in accordance with a number of embodiments of the present disclosure. Common numbering is used denote similar (e.g., the same) elements in FIGS. 2A and 2B.

Memory cell 200 may be adjacent to (e.g., over) a semiconductor 202, such as single crystal p$^-$ silicon. Source/drains 204 (e.g., source/drains 204-1 and 204-2) of memory cell 200 (e.g., n$^+$-type conductive regions) may be in semiconductor 202. In some examples, a source drain 204 may include a conductive region 206 (e.g., having an n$^-$ conductivity type) and a conductive region 208 (e.g., having an n$^+$ conductivity type). During operation of memory cell 200 (e.g., when memory cell 200 is activated), a channel 212 may be formed in semiconductor 202 between source/drains 204-1 and 204-2.

A conductor 209 (e.g., nickel silicide) may be in source/drains 204, for example, and may be coupled to or form a portion of a source/data line. For example, a conductor 209A may be in source/drain 204-1 and may be coupled to a source/data line 210A, such as any one of data lines 210A1 to 210A3 in FIG. 2B, by a contact 211A. A conductor 209B may be in source/drain 204-2 and may be coupled to a source/data line 210B, such as any one of data lines 210B1 to 210B3 in FIG. 2B by a contact 211B. Note, for example, that a contact 211A may be a shared by the memory cells 200-1 and 200-2 and that a contact 211B may be a shared by the memory cells 200-2 and 200-3, as shown in FIG. 2B. The term "coupled" may include directly coupled and/or directly connected with no intervening elements (e.g., by direct physical contact) or indirectly coupled and/or connected with intervening elements. In some examples, a first element being adjacent to a second element may include, but not necessarily require, the first element being in direct physical contact with the second element.

An interface dielectric 220, such as silicon dioxide (SiO$_2$) or oxygen-rich silicon oxynitride (OR-SiON), may be adjacent to semiconductor 202 and source/drains 204-1 and 204-2. Memory cell 200 may include dielectric stacks 225-1 and 225-2 that may be separated from each other and may be to store a charge independently of each other. A region between dielectric stacks 225-1 and 225-2 might not store any charge, for example. In some examples, interface dielectric 220 may be common to dielectric stacks 225-1 and 225-2 and the region therebetween. For example, dielectric stack 225-1 may be adjacent to a portion 220-1 of interface dielectric 220, and dielectric stack 225-2 may be adjacent to a portion 220-2 of interface dielectric 220. References to a dielectric stack 225 may include either of dielectric stacks 225-1 and 225-2.

A blocking dielectric 226, such as hafnium tantalum oxynitride (HfTaON), hafnium aluminum oxynitride (HfAlON), or lanthanum aluminate (LaAlO$_3$), may be adjacent (e.g., and common) to (e.g., in direct physical contact with) dielectric stacks 225-1 and 225-2 and interface dielectric 220. In some examples, dielectric stack 225-1, a portion 226-1 of blocking dielectric 226, and a portion 220-1 of interface dielectric 220 might form a dielectric stack 228-1 to store a charge, and dielectric stack 225-2, a portion 226-2 of blocking dielectric 226, and a portion 220-2 of interface dielectric 220 might form a dielectric stack 228-2 to store a charge. For example, dielectric stack 228-1 may include dielectric stack 225-1, portion 226-1 of blocking dielectric 226, and portion 220-1 of interface dielectric 220, and dielectric stack 228-2 may include dielectric stack 225-2, portion 226-2 of blocking dielectric 226, and portion 220-2 of interface dielectric 220. Note, for example, that a portion 226-3 of blocking dielectric 226 may be between dielectric stack 225-1 and dielectric stack 225-2 and may be adjacent to a portion 220-3 of interface dielectric 220. The region including the portions 220-3 and 226-3 may not store any charge, for example.

A dielectric stack 225 (e.g., each of dielectric stacks 225-2 and 225-2) may include a storage dielectric 232, such as silicon-rich nitride (SRN), that may be adjacent to interface dielectric 220. For example, storage dielectric 232 of dielectric stack 225-1 may be adjacent to portion 220-1 of interface dielectric 220, and storage dielectric 232 of dielectric stack 225-2 may be adjacent to portion 220-2 of interface dielectric 220. In some examples, storage dielectric 232 may be referred to as an injector dielectric (e.g., an injector-silicon-rich nitride (i-SRN)). For example, i-SRN may contain silicon nano-particles in nitride, where the silicon nano-particles may have a diameter of about the thickness of storage dielectric 232.

A tunnel dielectric 236, such as $SiO_2$ or OR-SiON, may be adjacent to storage dielectric 232 in a dielectric stack 225. A charge trap 240, such as gallium nitride (GaN), may be adjacent to tunnel dielectric 236 in a dielectric stack 225. A storage dielectric 242, such as i-SRN, may be adjacent to charge trap 236 in a dielectric stack 225.

Note, for example, that blocking dielectric 226 may be adjacent to the storage dielectric 242 in each of dielectric stacks 225-1 and 225-2. For example, portion 226-1 of blocking dielectric 226 may be adjacent to the storage dielectric 242 of dielectric stack 225-1, and portion 226-2 of blocking dielectric 226 may be adjacent to the storage dielectric 242 of dielectric stack 225-2.

A gate 245 may be adjacent to blocking dielectric 226. Gate 245, for example, may include an interface metallic, such as a gate-interface metallic (e.g., tantalum nitride (TaN)) adjacent to blocking dielectric 226 and a conductor, such as metal (e.g., tungsten, aluminum, etc.), polysilicon (e.g., doped polysilicon, such as $n^+$-doped polysilicon), etc., adjacent to the interface metallic. Gate 245 may be coupled to or form a portion of an access line 248 (e.g. any one of access lines 248-1 to 248-3 in FIG. 2B), such as a word line.

For example, a portion (e.g., a control-gate portion) 245-1, and thus a corresponding portion of the metallic interface, of gate 245 may be adjacent to portion 226-1 of blocking dielectric 226; a portion (e.g., a control-gate portion) 245-2, and thus a corresponding portion of the metallic interface, of gate 245 may be adjacent to portion 226-2 of blocking dielectric 226; and a portion (e.g., an access-gate portion) 245-3, and thus a corresponding portion of the metallic interface, of gate 245 may be adjacent to portion 226-3 of blocking dielectric 226. In some examples, portions 245-1 to 245-3 of gate 245 may respectively form or be respectively coupled to portions 249-1 to 249-3 of an access line 248 in FIG. 2B.

In some examples, portion 245-3 of gate 245, portion 226-3 of blocking dielectric 226, and portion 220-3 of interface dielectric 220 may act as (e.g., form) a fixed-threshold-voltage (Vt) portion (e.g., to within routine variations of the threshold voltage) 250 of memory cell 200 with a single Vt (e.g., to within routine variations of the Vt). In an example, the fixed Vt portion 250 may establish a lowest memory state, such as an erase state, of memory cell 200. For example, the fixed-Vt portion 250 may establish a more stable data state (e.g., with a smaller Vt range) than previous non-volatile memory cells, such as previous NROM memory cells. For example, the fixed Vt portion 250 may act to reduce the number of under and/or over erasures that may act to increase the Vt range of the erase state (e.g., thus resulting in a smaller erase Vt range).

In some examples, portion 245-1 of gate 245 and dielectric stack 228-1 may form a non-volatile portion 255-1 of memory cell 200, and portion 245-2 of gate 245 and dielectric stack 228-2 may form a non-volatile portion 255-2 of memory cell 200. For example, non-volatile portion 255-1 may include portion 245-1 of gate 245, a dielectric stack 225-1, and portion 220-1 of interface dielectric 220, and non-volatile portion 255-2 may include portion 245-2 of gate 245, dielectric stack 225-2, and portion 220-2 of interface dielectric 220.

In some examples, portion 220-1 of interface dielectric 220 may act as an interface tunnel dielectric of dielectric stack 228-1, and thus of non-volatile portion 255-1; portion 220-2 of interface dielectric 220 may act as an interface tunnel dielectric of dielectric stack 228-2, and thus of non-volatile portion 255-2; and portion 220-3 of interface dielectric 220 may act as an interface gate dielectric of fixed Vt portion 250. Note, for example, that dielectric stack 228-1 and portion 245-1 of gate 245 may form a gate stack of non-volatile portion 255-1, that dielectric stack 228-2 and portion 245-2 of gate 245 may form a gate stack of non-volatile portion 255-1, and that portion 220-3 of interface dielectric 220, portion 226-3 of blocking dielectric 226, and portion 245-3 of gate 245 may form a gate stack of fixed Vt portion 250. For example, portion 220-3 of interface dielectric 220 and portion 226-3 of blocking dielectric 226 may form a dielectric stack of fixed Vt portion 250. The interface metallic in the gate stacks, for example, may act to create, at least in part, the thresholds of the non-volatile portions 255-1 and 255-2 and the fixed Vt portion 250 (e.g., by controlling the metal-insulator work function of the respective gate stacks for the non-volatile portions 255-1 and 255-2 and the fixed Vt portion 250).

The fixed-Vt portion 250 and the non-volatile portions 255-1 and 255-2, for example, may be coupled in series between source/drains 204-1 and 204-2 by channel 212. For example, the fixed-Vt portion 250 may operate as a transistor, such as a FET, and each of the non-volatile portions may operate as a non-volatile memory cell. Note, for example, that portion 220-3 of interface dielectric 220 and portion 226-3 of blocking dielectric 226 may act as a gate dielectric for the fixed-Vt portion 250. For memory cell 200 to conduct, for example, the fixed-Vt portion 250 and the non-volatile portions 255-1 and 255-2 may need to be activated in response to a voltage applied to gate 245 (e.g., causing the respective portions of channel 212 adjacent thereto to conduct).

Dielectric stack 225-1, and thus non-volatile portion 255-1, and dielectric stack 225-2, and thus non-volatile portion 255-2, for example, may each be programmed to one of a plurality of states (e.g., data states), where each state corresponds to a different Vt level (e.g., Vt range corresponding to a Vt level due to statistical variation). Dielectric stack 225-1 may be to store either a different data state than dielectric stack 225-2 or to store the same data state as dielectric stack 225-2.

The number of data states, and thus the number of threshold voltage ranges, may, for example, be given by $2^n$, where n is the number of bits per the dielectric stack 225-1 and/or the dielectric stack 225-2. This means, for example, that memory cell 200 may have an increased bit density and may store 2n bits, n bits for each dielectric stack.

To store n=1 bit in each dielectric stack, for example, one of two data states (e.g., including the erase state) may be programmed in each dielectric stack, where one bit may correspond (e.g., may be assigned) to each data state. To store n=2 bits in each dielectric stack, for example, one of four data states (e.g., including the erase state) may be programmed in each dielectric stack, where two bits may correspond to each data state. To store n=3 bits in each dielectric stack, for example, one of eight data states (e.g., including the erase state) may be programmed in each dielectric stack, where three bits may correspond to each data state. To store n=4 bits in each dielectric stack, for example, one of 16 data states (e.g., including the erase state) may be programmed in each dielectric stack, where four bits may correspond to each data state, and so on.

Figure 3:
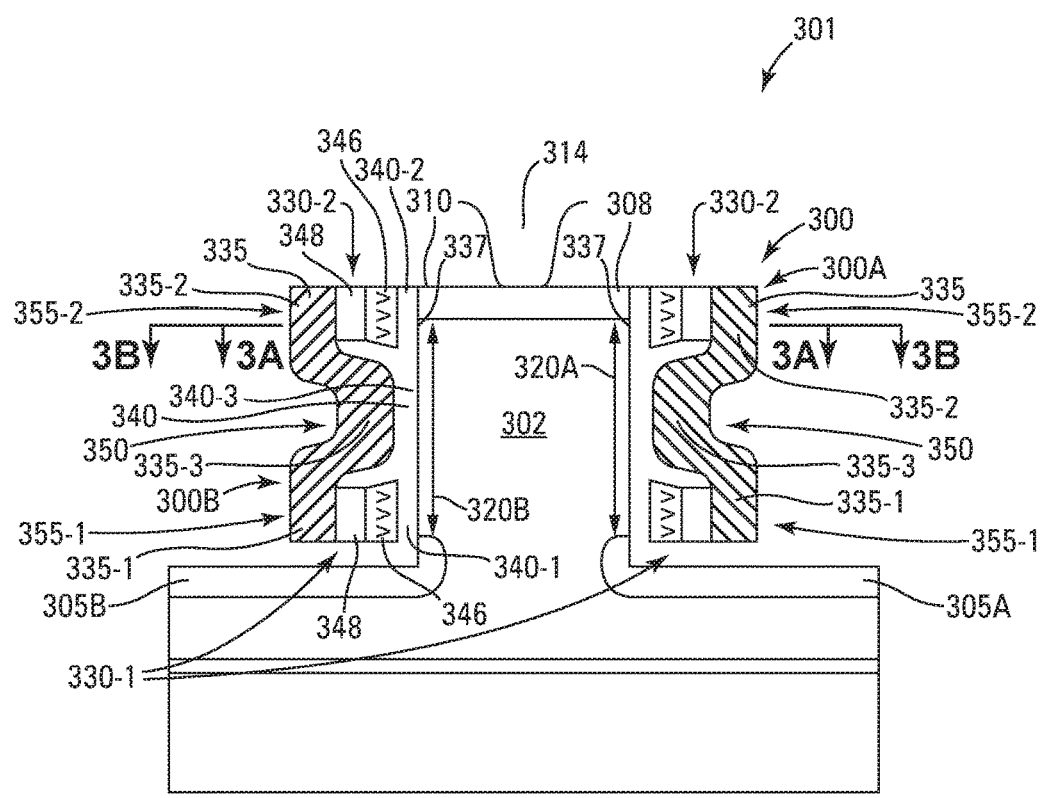
FIG. 3 cross-sectional view of an example of a portion of a memory array in accordance with a number of embodiments of the present disclosure.

FIG. 3 cross-sectional view of an example of a portion of a memory array 301 that may be a portion of memory array 106 in accordance with a number of embodiments of the present disclosure. In some examples, memory array 301 may include a (e.g., non-volatile) memory cell 300, such as a split-gate memory cell (e.g., a split-gate NROM cell).

Figure 3A:
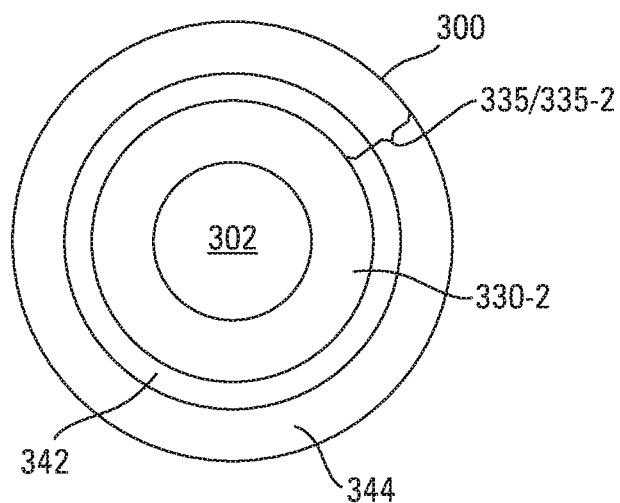
FIG. 3A is a view taken along line 3A-3A in FIG. 3 in accordance with a number of embodiments of the present disclosure.
Figure 3B:
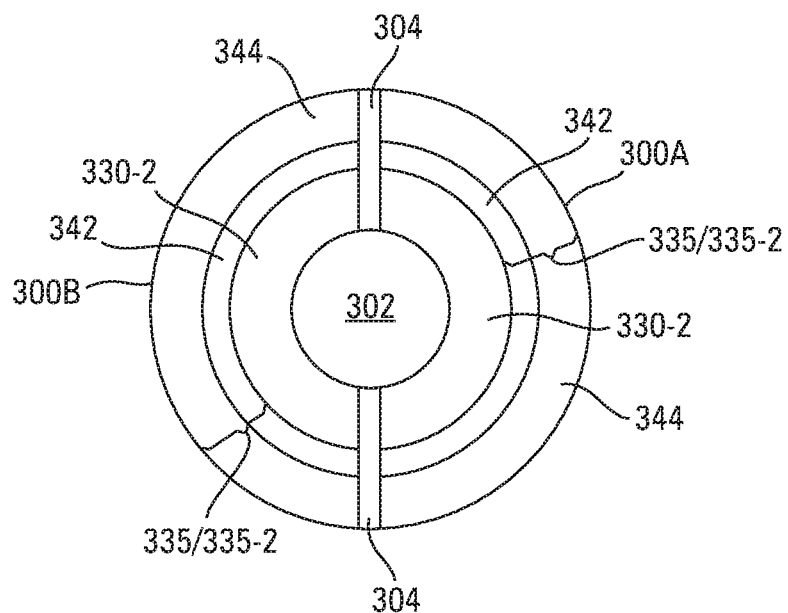
FIG. 3B is view taken along line 3B-3B in FIG. 3 in accordance with a number of embodiments of the present disclosure.

Memory cell 300 may wrap around at least a portion of a (e.g., vertical) semiconductor 302 (e.g. a vertical semiconductor pillar), such as single crystal p$^-$ silicon. For example, memory cell 300 may be a single (e.g., gate-all-around (GAA)) memory cell wrapped completely around semiconductor 302, as shown in FIG. 3A, a view taken along line 3A-3A in FIG. 3. In some examples, a memory cell 300 may be in a group (e.g., a string) of series-coupled memory cells. In other examples, memory cell 300 may be one of a memory cell 300A that may be wrapped around a portion of semiconductor 302 and a separate, independent memory cell 300B wrapped around another portion of semiconductor 302, as shown in FIG. 3B, a view taken along line 3B-3B in FIG. 3. For example, isolation regions 304 may electrically (e.g., and physically) isolate memory cell 300A from memory cell 300B.

The term "vertical" may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical. It should be recognized the term perpendicular takes into account variations from "exactly" perpendicular due to routine manufacturing and/or assembly variations and that one of ordinary skill in the art would know what is meant by the term perpendicular.

Source/drains 305A and 305B (e.g., n$^+$-type conductive regions) may be in semiconductor 302 and may be coupled a data line/source. In examples where there is a single memory cell 300, source/drains 305A and 305B may operate as a single source/drain for the single memory cell 300, but in examples where there may be separate memory cells 300A and 300B, source/drains 305A and 305B may be respectively for separate memory cells 300A and 300B.

A source/drain 308 (e.g., an n$^+$-type conductive region) may be in semiconductor 302. For example, an upper surface 310 of source/drain 308 may be coplanar with (e.g., form a portion of) an upper (e.g., topmost) surface of semiconductor 302. For example, source/drain 308 may be vertically above source/drains 305A and 305B. A data line/source 314 may be coupled to source/drain 308. In examples where there may be separate memory cells 300A and 300B source/drain may be common to both memory cells 300A and 300B.

During operation of memory cell 300A, for example, a vertical channel 320A may be formed between source/drain 305A and source/drain 308, where channel 320A may be adjacent (e.g., lateral) to memory cell 300A. During operation of memory cell 300B, for example, a vertical channel 320B may be formed vertically between source/drain 305B and source/drain 308, where channel 320B may be adjacent (e.g., lateral) to memory cell 300B. In examples where there is a single memory cell 300, there may be a single vertical channel in semiconductor 302 between source/drain 308 and source/drains 305A and 305B.

The expression lateral to may refer to a direction that may be perpendicular to the vertical direction, for example. In some examples, a first element being lateral to a second element may include, but not necessarily require, the first element being in direct physical contact with the second element. For example, in examples where semiconductor 302 might be circular (e.g., a circular pillar), lateral (e.g., a lateral direction) may be in a radial direction. A particular element being laterally between two elements may include the particular element being lateral to one of the two elements in a first direction and the other of the two other elements being lateral to the particular element in a second (e.g., opposite) direction. A particular element being vertically between two elements may include the particular element being vertically above one of the two elements and vertically below the other of the two other elements. Elements being vertically separated may include the elements being separated from each other in the vertical direction, along a vertical line or plane, for example.

Memory cell 300 (e.g., each of memory cells 300A and 300B), for example, may include a lower dielectric stack 330-1 to store charge and an upper dielectric stack 330-2 to store charge (e.g., where the upper dielectric stack 330-2 may be vertically above the lower dielectric stack 330-1). A region between lower dielectric stack 330-1 and upper dielectric stack 330-2 may not store any charge, for example. In some examples, for a single memory cell 300, each of dielectric stacks 330-1 and 330-2 may be a continuous structure completely around semiconductor 302, as shown for dielectric stack 330-2 in FIG. 3A. In examples for separate memory cells 300A and 300B, each of the dielectric stacks 330-1 and 330-2 for memory cell 300A may be around the portion of semiconductor 302 corresponding to memory cell 300A, and each of the dielectric stacks 330-1 and 330-2 for memory cell 300B may be around the portion of semiconductor 302 corresponding to memory cell 300B, as shown for the dielectric stack 330-2 for each of memory cells 300A and 300B in FIG. 3B. Note, for example, that the dielectric stacks 330-1 and 330-2 for memory cell 300A may be electrically (e.g., and physically) isolated from the dielectric stacks 330-1 and 330-2 for memory cell 300B by isolation region 304, as shown in FIG. 3B for dielectric stacks 330-2.

In some examples, for a single memory cell 300, gate 335 may be a continuous structure completely around semiconductor 302, as shown in FIG. 3A. In examples for separate memory cells 300A and 300B, the gate 335 for memory cell 300A may be around the portion of semiconductor 302 corresponding to memory cell 300A, and the gate 335 for memory cell 300B may be around the portion of semiconductor 302 corresponding to memory cell 300B, as shown in FIG. 3B. Note, for example, that the gate 335 for memory cell 300A may be electrically (e.g., and physically) isolated from the gate 335 for memory cell 300B by isolation region 304, as shown in FIG. 3B.

Dielectric stacks 330-1 and 330-2 may be adjacent (e.g., and lateral) to a vertical side 337 of semiconductor 302. For example, a lower dielectric stack 330-1 may be laterally between a lower (e.g. control-gate) portion 335-1 of a gate 335 and the vertical side 337 of semiconductor 302, and upper dielectric stack 330-2 may be laterally between an upper (e.g. control-gate) portion 335-2 of a gate 335 and the vertical side 337. For example, a lower dielectric stack 330-1 may be adjacent (e.g., and lateral) to a portion of either source/drain 305A or 305B that extends adjacent to (e.g., forms a portion, such as a lower portion, of) vertical side 337 of semiconductor 302, as shown in FIG. 3A. An upper dielectric stack 330-2 may be adjacent (e.g., and lateral) to a portion of source/drain 308 (e.g., forms a portion of, such as an upper portion of) vertical side 337 of semiconductor 302, as shown in FIG. 3A.

In some examples, portion 335-1 of gate 335 may wrap completely around lower dielectric stack 330-1, and portion 335-2 of gate 335 may wrap completely around upper dielectric stack 330-2, as shown in FIG. 3A for portion 335-2 and upper dielectric stack 330-2. In other examples, portion 335-2 of gate 335 of memory cell 300A may wrap around at least a portion (e.g., follow the periphery (e.g., the curvature)) of the upper dielectric stack 330-2 of memory cell 300A, and portion 335-2 of gate 335 of memory cell 300B may wrap around at least a portion (e.g., follow the periphery (e.g., the curvature)) of the upper dielectric stack 330-2 of memory cell 300B, as shown in FIG. 3B. Similarly, for example, portion 335-1 of gate 335 of memory cell 300A may wrap around at least a portion (e.g., follow the periphery (e.g., the curvature)) of the lower dielectric stack 330-1 of memory cell 300A, and portion 335-1 of gate 335 of memory cell 300B may wrap around at least a portion (e.g., follow the periphery (e.g., the curvature)) of the lower dielectric stack 330-1 of memory cell 300B.

A portion 340-3 of an interface dielectric 340, such as silicon dioxide ($SiO_2$), may be laterally between a (e.g., an access-gate) portion 335-3 of gate 335 and vertical side 337. For example, portion 335-3 may be vertically between dielectric stacks 330-1 and 330-2. Portions 335-1, 335-2, and 335-3 of gate 335 may be contiguous so that gate 335 may be a continuous structure. The portion 340-3 of interface dielectric 340 may be in direct physical contact with portion 335-3 of gate 335 and with vertical side 337.

A gate 335, for example, may include an interface metallic 342, such as a gate-interface metallic (e.g., tantalum nitride (TaN)) adjacent (e.g., and lateral) to (e.g., in direct physical contact with) dielectric stacks 335-1 and 335-2 and portion 340-3 of interface dielectric 340, and a conductor 344, such as metal (e.g., tungsten, aluminum, etc.), polysilicon (e.g., doped polysilicon, such as n$^+$-doped polysilicon), etc., adjacent to the interface metallic 342, as shown in FIGS. 3A and 3B for dielectric stack 330-2. For example, interface metallic 342 may be laterally between conductor 344 and dielectric stacks 330-1 and 330-2 and laterally between conductor 344 and portion 340-3 of interface dielectric 340.

A dielectric stack 330-1, for example, may include a portion 340-1 of the interface dielectric 340, a charge trap 346, such as silicon nitride ($SiN_4$), adjacent (e.g., and lateral) to portion 340-1, and a blocking dielectric 348, such as hafnium oxide ($HfO_2$) and aluminum oxide ($Al_2O_3$), adjacent (e.g., and lateral) to charge trap 346. A dielectric stack 330-2, for example, may include a portion 340-2 of the interface dielectric 340, a charge trap 346 adjacent (e.g., and lateral) to portion 340-2, and a blocking dielectric 348 adjacent (e.g., and lateral) to charge trap 346. For example, a portion (e.g., either a portion 340-1 or a portion 340-2) of the interface dielectric 340 may act as an interface tunnel dielectric of a dielectric stack 330. Interface metallic 342, for example, may be lateral to (e.g., and in direct physical contact with) the blocking dielectric 348 in each of dielectric stacks 330-1 and 330-2.

In some examples, the portion (e.g., either a portion 340-1 or a portion 340-2) of the interface dielectric 340 of a dielectric stack 330 may be in direct physical contact with vertical side 337 of semiconductor 302; charge trap 346 may be in direct physical contact with the portion of the interface dielectric 340; blocking dielectric 348 may be in direct physical contact with charge trap 346; and interface metallic 342, and thus a portion of gate 335 (e.g., either portion 335-1 or 335-2), in direct physical contact with blocking dielectric 348.

In some examples, portion 335-3 of a gate 335 and portion 340-3 of an interface dielectric 340 (e.g., that may act as an interface gate dielectric) may act as (e.g., form) a fixed-threshold-voltage (Vt) portion (e.g., to within routine variations of the threshold voltage) 350 of a memory cell 300 (e.g., either memory cell 300 acting as a single memory cell or either of separate memory cells 300A and 300B) with a single Vt (e.g., to within routine variations of the Vt). In an example, the fixed Vt portion 350 may establish a lowest memory state, such as an erase state, of a memory cell 300. For example, the fixed-Vt portion 350 may establish a more stable data state (e.g., with a smaller Vt range) than previous non-volatile memory cells, such as previous NROM memory cells. For example, the fixed Vt portion 350 may act to reduce the number of under and/or over erasures that may act to increase the Vt range of the erase state (e.g., thus resulting in a smaller erase Vt range).

In some examples, portion 335-1 of a gate 335 and a dielectric stack 330-1 may form a non-volatile portion 355-1 of a memory cell 300, and portion 335-2 of a gate 335 and a dielectric stack 330-2 may form a non-volatile portion 355-2 of a memory cell 300. For example, non-volatile portion 355-1 may include portion 335-1 of a gate 335 and a dielectric stack 330-1, and non-volatile portion 355-2 may include portion 335-2 of a gate 335 and dielectric stack 330-2. The fixed-Vt portion 350 and the non-volatile portions 355-1 and 355-2, for example, may be coupled in series between a source/drain 308 and source/drains 305A and 305B by a channel 320.

Dielectric stacks 330-1 and 330-2, and thus non-volatile portions 355-1 and 355-2, may store one or more bits, such as described above for memory cell 200 in conjunction with FIG. 2A.

In some examples, a memory cell 300, such as each of memory cells 300A and 300B may be as described above in conjunction with FIG. 2A for memory cell 200. For example, each of the dielectric stacks 330-1 and 330-2 may be include the same dielectrics as the dielectric stacks 228-1 and 228-2 discussed in conjunction with FIG. 2A.

Figure 4:
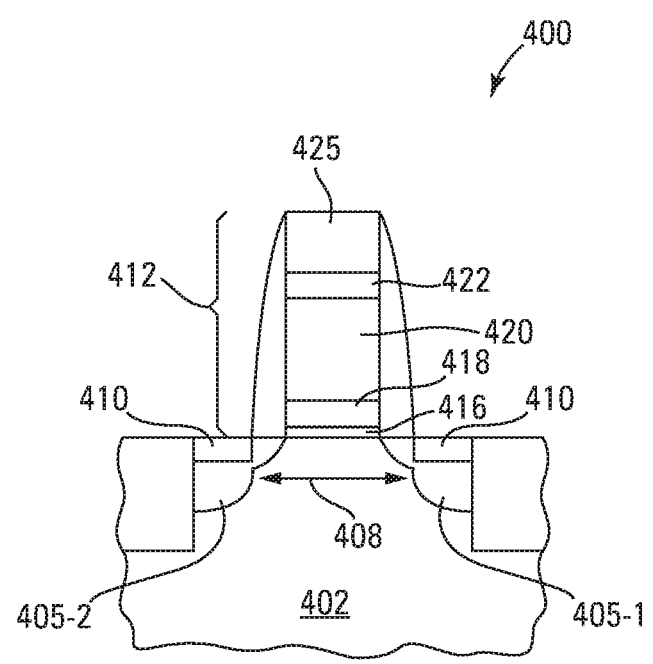
FIG. 4 illustrates an example of a transistor in accordance with a number of embodiments of the present disclosure.

FIG. 4 illustrates an example of a transistor 400, such as an n-FET or a p-FET in accordance with a number of embodiments of the present disclosure. For example, transistor 400 may be used in logic, such as in controller 104 and/or control circuitry 124, and/or as a select transistor, such as in memory array 106. In some examples, transistor 400 may be referred to as a memory transistor, such as a non-volatile-memory (NVM) transistor.

Transistor 400 may be adjacent to (e.g., over) a semiconductor 402. Source/drains 405-1 and 405-2 may be in semiconductor 402, such as conductively doped n$^+$ silicon regions, where the transistor is an n-FET. For example, when transistor 400 operates, a channel 408 may be formed in semiconductor 402 near the top surface of semiconductor 402 and below the gate 425 and between source/drains 405-1 and 405-2. Semiconductor 402 may be p⁻ silicon and source/drains 405-1 and 405-2 may be (e.g., heavily) doped n⁺ regions formed in semiconductor 402. In examples where transistor 400 is a p-FET, semiconductor 402 may be n⁻ silicon substrate and source/drains 405-1 and 405-2 may be (e.g., heavily) doped p⁺ regions formed in the semiconductor 402. In some examples, a conductive region 410 such as metal-silicide (e.g., nickel silicide) may be formed, in each of source/drain regions 405-1 and 405-2 near the surface. Conductive regions 410 may help control the resistivity of transistor 400, for example, when the channel 408 is conducting.

Transistor 400 may include a gate stack 412. For example, gate stack 412 may include a (e.g., tunnel) dielectric 416, such as OR-SiON, adjacent to semiconductor 402 and a (e.g., tunnel) dielectric 418, such as hafnium silicon oxynitride (HfSiON), adjacent to dielectric 416. For example, dielectric 416 and dielectric 418 may form a double-layer tunnel dielectric, of gate stack 412, and thus for transistor 400.

Gate stack 412 may include a (e.g., work-function-tuned) metallic 420 (e.g., an interface metallic), such as nickel-fully-silicided (Ni-FuSi), adjacent to dielectric 418, such as for common application for logic FETs as well as for the memory transistors. An additional metallic 422 (e.g., an interface metallic), such as TaN, may or may not be provided to be adjacent to metallic 420. Gate stack 412 may include a control gate 425, such as metal (e.g., tungsten, aluminum, etc.), polysilicon (e.g., doped polysilicon, such as n⁺-doped polysilicon), etc., adjacent to metallic 422. Metallic 420 and/or metallic 422 may, for example, form an interface metallic that may interface the stack of dielectric 416 and dielectric 418 and control gate 425. For example, metallic 420 may act to control the work function between control gate 425 and semiconductor 402 that may act to control the threshold of memory transistor 400 as well as logic FET transistors, such as when the devices are scaled to sub 50 nm feature sizes.

Figure 5:
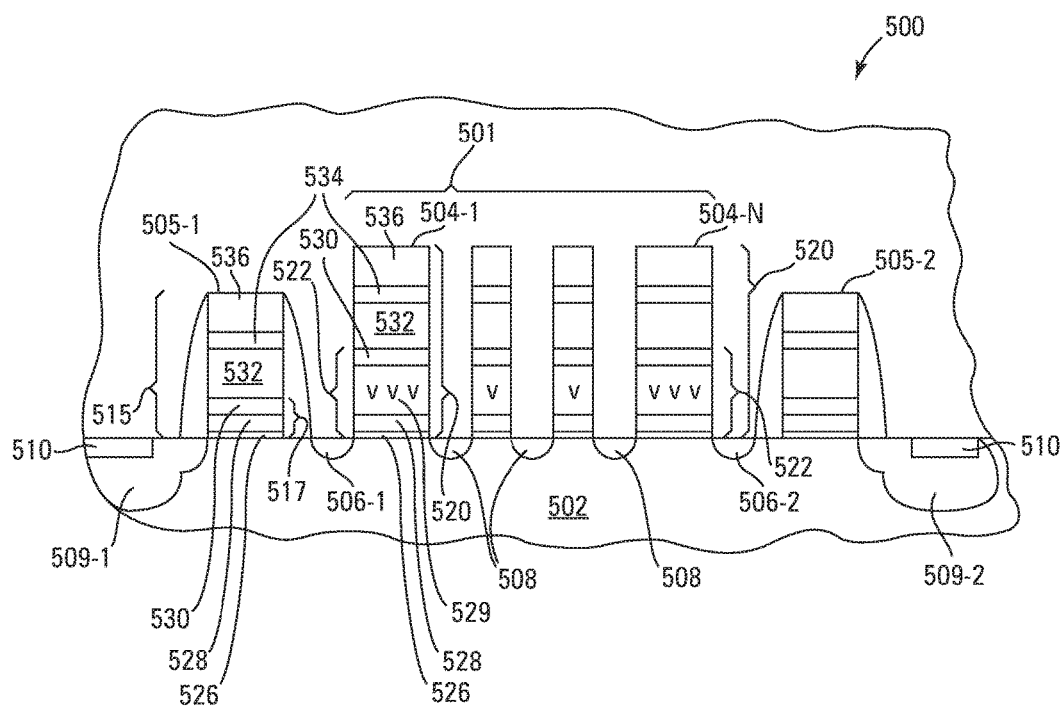
FIG. 5 illustrates an example of a portion of a memory array in accordance with a number of embodiments of the present disclosure.

FIG. 5 illustrates an example of a portion of a memory array 500 (e.g., that may be a portion of the memory array 106) in accordance with a number of embodiments of the present disclosure. For example, memory array 500 may include a group (e.g., a string 501, such as a NAND string) of series-coupled memory cells 504-1 to 504-N that may, in some examples, include the gate stack 412, as discussed above, and that may be adjacent to a semiconductor 502, such as single crystal p⁻ silicon. For example, memory cell 504-1 may be coupled in series with a select transistor 505-1 (e.g., by a source/drain 506-1, such as of n⁺ polysilicon, in semiconductor 502), and memory cell 504-N may be coupled in series with a select transistor 505-2 (e.g., by an n+ source/drain 506-2, such as in semiconductor 502) so that string 501 may be coupled in series between select transistor 505-1 and select transistor 505-2. Note, for example, that n+ source/drains 508, in semiconductor 502 may couple memory cells 504-1 to 504-N in series. It may also be noted that the string 501 may consist of multiple memory transistor elements as described in 400 earlier.

Select transistor 505-1 may be coupled to a source/drain 509-1 that may be coupled to a source so that select transistor 505-1 is coupled in series between source/drain 509-1, and thus the source, and memory cell 504-1. Select transistor 505-2 may be coupled to a source/drain 509-2 that may be coupled to a data line so that select transistor 505-2 is coupled in series between source/drain 509-2, and thus the data line, and memory cell 504-N. For example, source/drains 509-1 and 509-2 may be in semiconductor 502 and may be n⁺ silicon, meaning, for example, that select transistor 505-1 and 505-2 may be n-FETs.

In some examples, a conductive region 510, such as nickel silicide, may be in each of source/drains 509-1 and 509-2. For example, the conductive region 510 in source/drain 509-1 may be coupled to the source so as to couple the source to source/drain 509-1, and the conductive region 510 in source/drain 509-2 may be coupled to the data line so as to couple the data line to source/drain 509-2.

A select transistor 505 (e.g., each of select transistors 505-1 and 505-2), for example, may include a gate stack 515 that may include a dielectric stack 517, such as for a fixed-threshold-voltage (Vt) (e.g., to within routine variations of the threshold voltage). For example, a select transistor 505 may be referred to as a fixed-threshold element (e.g., fixed-threshold transistor). A memory cell 504 (e.g., each of memory cells 504-1 to 504-N), for example, may include a gate stack 520 that may include a dielectric stack 522, such as for a variable threshold voltage. For example, a memory cell 504 may be referred to as a variable-threshold NVM element (e.g., variable threshold NVM transistor).

In some example, dielectric stack 517 and dielectric stack 522 may, for example, include a dielectric 526 (e.g., about 1.0 to about 1.5 nanometers thick), such as OR-SiON, adjacent to semiconductor 502 and a dielectric 528 (e.g., about 3.0 to about 4.0 nanometers thick), such as hafnium silicon oxynitride (HfSiON), adjacent to dielectric 526. For example, dielectric 526 and dielectric 528, together may form a double-layer gate dielectric for the fixed threshold element (e.g. a transistor 505) and at the same time as a double-layer tunnel dielectric of the dielectric stack 522 of the variable-threshold NVM element (e.g., a memory cell 504) in the string 501.

Dielectric stack 522 may include, for example, a charge trap 529 (e.g., about 5.0 nanometers think), such as a nitride (e.g., SiN₄, GaN, etc.), adjacent to dielectric 528. Dielectric stack 522 may include a blocking dielectric 530 (e.g., about 4.0 nanometers thick), such as HfSiON, adjacent to charge trap 529.

Depending on the design objective of the fixed-threshold voltage of dielectric stack 517, for example, blocking dielectric 530 may also be incorporated into dielectric stack 517 simultaneously. For example, the blocking dielectric 530 of dielectric stack 517 may be adjacent to dielectric 528 in dielectric stack 517.

Gate stacks 515 and 520 may include a (e.g., common) metallic 532, such as a fully silicided (FuSi) (e.g., Ni-FuSi) metallic, adjacent to blocking dielectric 530, and thus dielectric stacks 517 and 522. An additional metallic 534 of gate stacks 515 and 520, such as TaN, may be adjacent to metallic 532. Gate stacks 515 and 520 may include a control gate 536, such as metal (e.g., tungsten, aluminum, etc.), polysilicon (e.g., heavily doped polysilicon), such as n⁺-doped polysilicon, etc., adjacent to metallic 534. Metallic 532 and metallic 534 may form an interface metallic between control gate 536 and dielectric stacks 517 and 522. For example, metallic 532 may act to control the work function between control gate 536 and semiconductor 502 that may act to control the threshold of transistors 505-1 and 505-2 (e.g., at ends of string 501) and of memory cells 504-1 to 504-N, such as when dielectric stacks 517 and 522 may be implemented for smaller feature size technology nodes.

Figure 6A:
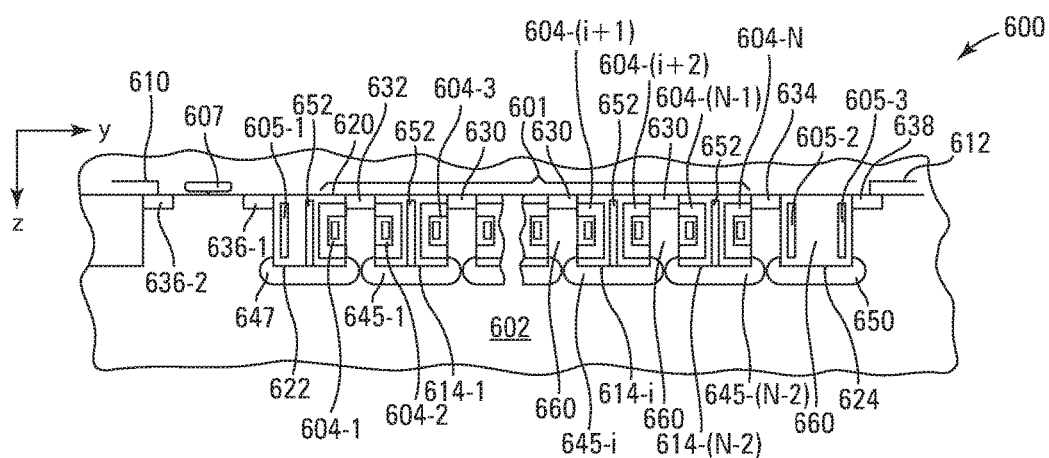
FIG. 6A is a cross-sectional view of an example of a portion of a memory array in accordance with a number of embodiments of the present disclosure.

FIG. 6A is a schematic cross-sectional view of an example of a portion of a memory array 600 (e.g., that may be a portion of the memory array 106), such as a vertical channel NAND containing a set of split-gate NVM cells, in accordance with a number of embodiments of the present disclosure. For example, memory array 600 may include a group (e.g., a string 601, such as a NAND string) of series-coupled memory (e.g., NVM) cells 604-1 to 604-N that may be in a semiconductor 602, such as single crystal p⁻ silicon. Memory cell 604-1 may be coupled in series with a (e.g., fixed-threshold) select transistor 605-1 that may, in some examples, be coupled in series with a (e.g., fixed-threshold) select transistor 607 that may be coupled in series with a data line 610. Memory cell 604-N may be coupled in series with a (e.g., fixed-threshold) select transistor 605-2 that may be coupled in series with a (e.g., fixed-threshold) select transistor 605-3 that may be coupled in series with a source 612 that may be connected to a common source.

Select transistor 605-1, for example, may be to selectively couple memory cell 604-1, and thus string 601, select transistor 607 that may be to selectively couple transistor 605-1, and thus memory cell 604-1, and thus string 601, to data line 610. In some examples, select transistor 607 may be omitted, and select transistor 605-1 may be to selectively couple memory cell 604-1, and thus string 601, to data line 610. Select transistor 605-2, for example, may be to selectively couple memory cell 604-N, and thus string 601, to select transistor 605-3 that may be to selectively couple transistor 605-2, and thus memory cell 604-N, and thus string 601, to source 612 that may be commonly coupled for all strings.

A pair of series-coupled NVM memory cells 604 may be in each of regions (e.g., trenches) 614-1 to 614-(N−2) that may extend into semiconductor 602 (e.g., in the vertical direction, such as the z-direction) below, for example, an upper (e.g., a topmost) surface 620 of semiconductor 602. For example, a pair of series-coupled memory cells 604-2 and 604-3 may be in region 614-1; a pair of series-coupled memory cells 604-(i+1) and 604-(i+2) may be in region 614-I; and a pair of series-coupled memory cells 604-(N−1) and 604-N may be in region 614-(N−2). In some examples, memory cell 604-1 and select transistor 605-1 may be in a region (e.g., a trench) 622 that may extend into semiconductor 602 below the upper surface 620, and select transistors 605-2 and 605-3 may be in a region (e.g., a trench) 624 that may extend into semiconductor 602 below the upper surface 620.

Conductive regions (e.g., n+ conductive regions), such as source/drains 630, may be in semiconductor 602 and may couple regions 614-1 to 614-(N−2) in series. For example, a source/drain 630 may be (e.g., laterally) between successively (e.g., immediately) adjacent regions 614. For example, a source/drain 630 may be in a portion 660 of semiconductor 602 that is between successive regions 614-i and 614-(N−2) and that forms a vertical side of each regions 614-i and 614-(N−2). For example, memory cell 604-(i+1) in region 614-i and memory cell 604-(N−1) in region 614-(N−2) may be adjacent to that portion 660 of semiconductor 602, where that portion 660 of semiconductor 602 may be between the successive memory cells 604-(i+1) and 604-(N−1).

A conductive region (e.g., an n+ conductive region), such as a source/drain 632, may be a portion of semiconductor 602 between successive regions 622 and 614-1 and may couple region 622 with region 614-1, and thus memory cell 604-1 in series with memory cell 604-2. For example, source/drain 632 may be (e.g., laterally) between region 622 and region 614-1.

A conductive region (e.g., an n+ conductive region), such as a source/drain 634, may be in a portion of semiconductor 602 between successive regions 612-N and 624 and may couple region 612-N in series with region 624, and thus memory cell 604-N in series with select transistor 605-2. For example, source/drain 634 may be (e.g., laterally) between region 624 and region 614-N. A conductive region (e.g., an n+ conductive region), such as a source/drain 636-1, may be in semiconductor 602 and may couple select transistor 605-1 in series with select transistor 607, and a conductive region (e.g., an n+ conductive region), such as a source/drain 636-2, may be in semiconductor 602 and may couple select transistor 607 in series with data line 610. A conductive region (e.g., an n+ conductive region), such as a source/drain 638, may be in semiconductor 602 and may couple select transistor 605-3 in series with source 612. In some examples, an upper (e.g., a topmost) surface of each of source/drains 630, 632, 634, 636-1, 636-2, and 638 may be coplanar with upper surface 620 of semiconductor 602.

Conductive regions (e.g., an n+ conductive region), such as source/drains 645-1 to 645-(N−2), may be in semiconductor 602 vertically below the upper surface 620 and the source/drains 630, 632, 634, 636-1, 636-2, and 638. For example, a source/drain 645 may couple the memory cells 604 of the pair of memory cells in a region 614 in series. For example, source/drain 645-1 may couple memory cells 604-2 and 604-3 in region 614-1 in series; source/drain 645-i may couple memory cells 604-(i+1) and 604-(i+2) in region 614-i in series; and source/drain 645-N may couple memory cells 604-(N−1) and 604-N in region 614-(N−2) in series.

A conductive region (e.g., an n+ conductive region), such as a source/drain 647, may be in semiconductor 602 vertically below the upper surface 620 and the source/drains 630, 632, 634, 636-1, 636-2, and 638. For example, source/drain 647 may couple select transistor 605-1 in series with memory cell 604-1. A conductive region (e.g., an n+ conductive region), such as a source/drain 650, may be in semiconductor 602 vertically below the upper surface 620 and the source/drains 630, 632, 634, 636-1, 636-2, and 638. For example, source/drain 650 may couple select transistor 605-2 in series with select transistor 605-3.

In some examples, source/drain 636-1 may be in a vertical portion of semiconductor 602 that may form a vertical side of region 622. Select transistor 605-1 may be adjacent to that portion of the semiconductor and between source/drain 636-1 and source/drain 647. Source/drain 632, for example, may be in a vertical portion of semiconductor that is between, and forms vertical sides of, successive regions 622 and 614-1, and is thus between successive memory cells 604-1 and 604-2. For example, successive memory cells 604-1 and 604-2 may be adjacent to that vertical portion of semiconductor 602.

Source/drain 634, for example, may be in a vertical portion of semiconductor that is between, and forms vertical sides of, successive regions 614-(N−2) and 624, and is thus between memory cell 604-N and select transistor 605-2. For example, memory cell 604-N and select transistor 605-2 may be adjacent to that vertical portion of semiconductor 602.

A conductor 652, such as n⁺ polysilicon, may be in each of regions 614-1 to 614-(N−2) and 622 within the substrate 602, and vertically below upper surface 620 of semiconductor substrate 602. For example, a conductor 652 may be coupled to (e.g., by direct physical contact with) each of the source/drains 645-1 to 645-(N−2) and 647.

Figure 6B:
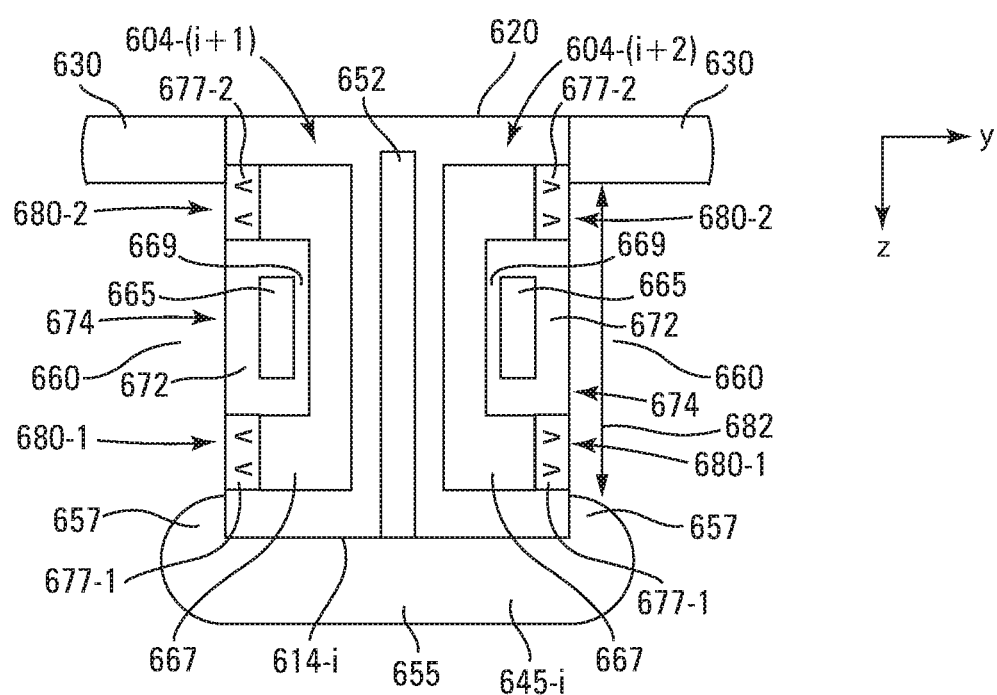
FIG. 6B is an enlarged cross-sectional view of a region of FIG. 6A.

FIG. 6B is an enlarged cross-sectional view of region 614-i of FIG. 6A in accordance with a number of embodiments of the present disclosure. For example, region 600-$i$ may be represent any one (e.g., each) of regions 614-1 to 614-(N−2) of FIG. 6A, including region 614-($i$+1) that is successive to region 614-$i$ in FIG. 6C. A portion 655 of source/drain 645-$i$ may be vertically below region 614-$i$, and portions 657 of source/drain 645-$i$ may extend into vertical portions 660 of semiconductor 602 that may form vertical sides of region 614-$i$.

Each of (e.g., the pair of) memory cells 604-($i$+1) and 604-($i$+2) may represent any one of memory cells 604-1 to 604-N. For example, each of memory cells 604-1 to 604-N may be configured as each of memory cells 604-($i$+1) and 604-($i$+2). Memory cells 604-($i$+1) and 604-($i$+2), for example, may be split-gate non-volatile memory cells (e.g., a split-channel non-volatile memory cells).

Each of memory cells 604-($i$+1) and 604-($i$+2) may include an access gate 665 adjacent (e.g., and lateral) to a portion 660, and a control gate 667 coupled to an access gate 665. For example, a dielectric 669 (e.g., an oxide, such as SiO2) may be between access gate 665 and control gate 667 and may capacitively couple access gate 665 to control gate 667. An interface dielectric 672 (e.g., SiO$_2$ or OR-SiON) may be adjacent (e.g., and lateral) to a portion 660 of semiconductor 602 and laterally between that portion 660 of semiconductor 602 and an access gate 665. Interface dielectric 672 and access gate 665 may form a fixed-threshold-voltage (Vt) portion (e.g., to within routine variations of the threshold voltage) 674 of memory cells 604-($i$+1) and 604-($i$+2) with a single Vt (e.g., to within routine variations of the Vt). For example, interface dielectric 672 may act as a tunnel dielectric for the fixed Vt portion.

For example, the fixed-Vt portion 674 may establish a more stable data state (e.g., with a smaller Vt range) than previous non-volatile memory cells, such as previous NAND memory cells. For example, the fixed Vt portion 674 may act to reduce the number of under and/or over erasures that may act to increase the Vt range of the erase state (e.g., thus resulting in a smaller erase Vt range).

Each of memory cells 604-($i$+1) and 604-($i$+2) may include a dielectric stack 677, to store a charge, vertically above and vertically below access gate 665 and between control gate 667 and an adjacent portion 660 of semiconductor 602. For example, dielectric stacks 677 may be adjacent to portion 660 of semiconductor 602, and, for example, may be lateral to portion 660 of semiconductor 602 in the y-direction, and, for example may extend laterally in the y-direction from portion 660 to control gate 667.

For example, there may be a lower dielectric stack 677-1 between a lower portion of control gate 667 and portion 660 of semiconductor 602 that is vertically below access gate 665. There may, for example, be an upper dielectric stack 677-2 between an upper portion of control gate 667 and portion 660 of semiconductor 602 that is vertically above access gate 665 and vertically above lower dielectric stack 677-1. For example, lower dielectric stack 677-1 may be adjacent to a portion 657 of source/drain 655, and upper dielectric stack 677-2 may be adjacent to a source/drain 630. In some examples, each of dielectric stacks 677-1 and 677-2 may be as described above for (e.g., may include the dielectrics of) dielectric stack 330 in conjunction with FIG. 3 or as described above for (e.g., may include the dielectrics of) the dielectric stacks 228-1 and 228-2 in conjunction with FIG. 2A.

The lower portion of control gate 667 and the dielectric stack 677-1 (e.g., coupled to the lower portion of control gate 667) may from a lower non-volatile portion 680-1 of memory cells 604-($i$+1) and 604-($i$+2), and the upper portion of control gate 667 and the dielectric stack 677-2 (e.g., coupled to the upper portion of control gate 667) may from an upper non-volatile portion 680-2 of memory cells 604-($i$+1) and 604-($i$+2). The fixed-Vt portion 674 and the non-volatile portions 680-1 and 680-2, for example, may be coupled in series between a source/drain 630 and source/drain 645$i$ (e.g., a portion 657 of source/drain 645$i$) by a vertical channel 682 that may form in a portion 660 of semiconductor 602 between source/drain 630 and source/drain 645$i$ when fixed-Vt portion 674 and the non-volatile portions 680-1 and 680-2 are activated.

In some examples, control gate 667 may include an interface metallic, such as a gate-interface metallic (e.g., TaN), adjacent (e.g., and lateral) to (e.g., in direct physical contact with) each of dielectric stacks 677-1 and 677-2 and a conductor, such as metal (e.g., tungsten, aluminum, etc.), polysilicon (e.g., doped polysilicon, such as n$^+$-doped polysilicon), etc., adjacent to the interface metallic. For example, the interface metallic may be laterally between the conductor and dielectric stacks 677-1 and 677-2. Access gate 665 may include an interface metallic (e.g., TaN) adjacent (e.g., and lateral) to (e.g., in direct physical contact with) interface dielectric 672 and a conductor, such as metal (e.g., tungsten, aluminum, etc.), polysilicon (e.g., doped polysilicon, such as n$^+$-doped polysilicon), etc., adjacent to the interface metallic.

Dielectric stacks 677-1 and 677-2, and thus non-volatile portions 680-1 and 680-2, may store one or more bits, such as described above for memory cell 200 in conjunction with FIG. 2A.

Figure 6C:
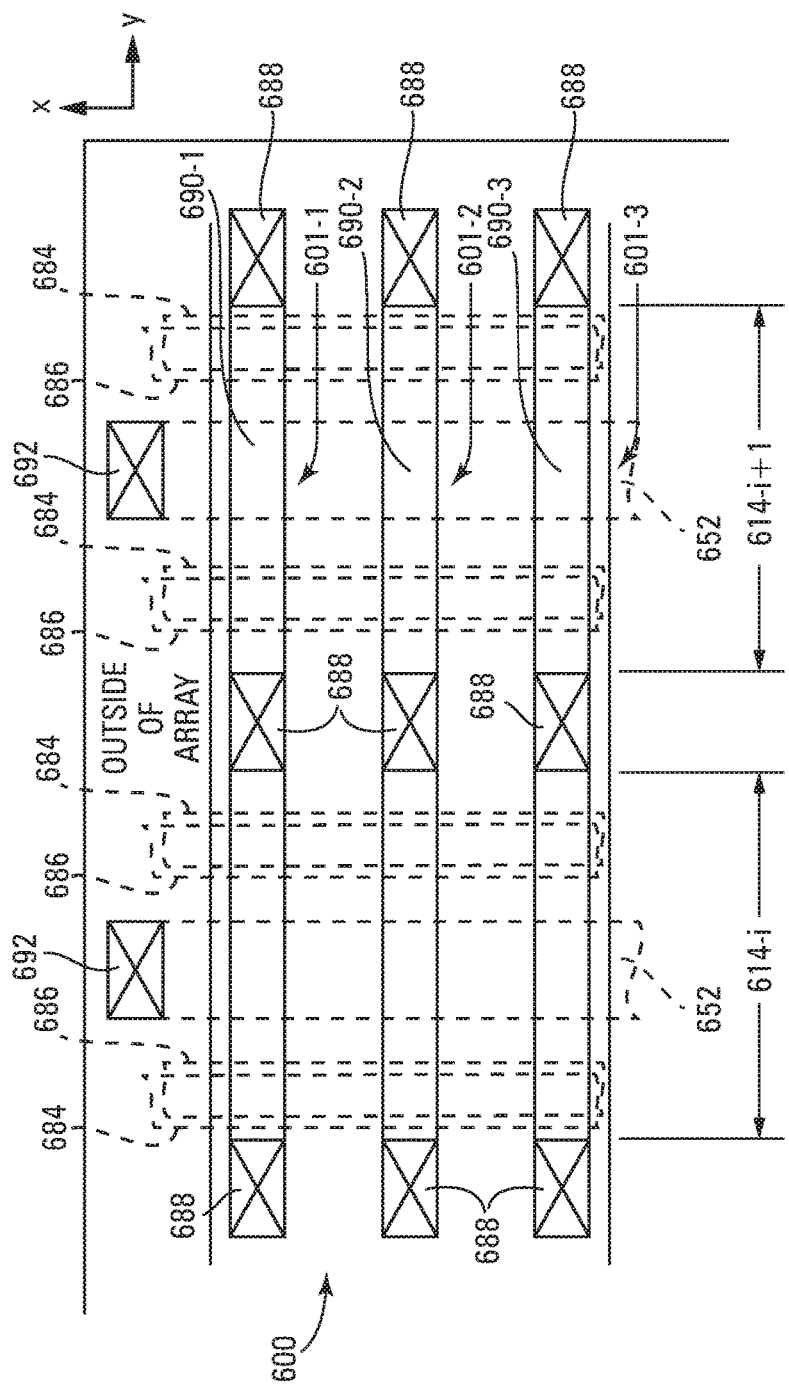
FIG. 6C is a top-down view of a memory array in accordance with a number of embodiments of the present disclosure.

FIG. 6C is a top-down view of memory array 600 in accordance with a number of embodiments of the present disclosure. Common numbering is used denote similar (e.g., the same) elements in FIGS. 6A-6C. FIGS. 6A and 6B may be in the y-z plane, where the z-direction may be in the vertical direction. FIG. 6C may be in the x-y plane, where the x-direction is perpendicular to the face plane of FIGS. 6A and 6B, and the z-direction is perpendicular to the face plane of FIG. 6C. The dashed lines in FIG. 6C denote elements that are vertically below the upper surface 620 of semiconductor 602. For example, semiconductor 602 might be a base structure, and upper surface 620 might be a base surface (e.g., in the x-y plane) of an integrated circuit die that might include memory array 600. The vertical (e.g., the z-) direction may be perpendicular to the base surface, for example.

Access gate 665, for example, may be vertically below upper surface 620 of semiconductor 602 and may be connected to or form a portion of an access line 684 (e.g., extending in the x-direction in FIG. 3C), such as a word line. Control gate 667, for example, may be vertically below upper surface 620 of semiconductor 602 and may be connected to or form a portion of a control line (e.g., a program line) 686 (e.g., extending in the x-direction in FIG. 6C).

Respective ones of electrically conductive contacts 688 may be respectively coupled to (e.g., e.g., with direct physical contact with) respective ones of source/drains 630 and may couple a conductor (e.g., a conductive line) 690 (e.g., of aluminum, copper, tungsten, etc.) to the source/drains 630 in a string 601. For example, conductors 690-1 to 690-3 (e.g., extending in the y-direction FIG. 6C) may respectively correspond to, and may be respectively coupled to the contacts 630 in, strings 601-1 to 601-3 and to data line 325. Contacts 688 might be self-aligned contacts that might self-align with source/drains 630 and a conductor 690. The use and formation of self-aligned contacts is well known in the art and will not be detailed herein.

A conductor 652 might be coupled to a contact 692 (e.g., outside of array 600), as shown in FIG. 6C. In some examples, all contacts, except for contacts 688 that may be self-aligned to be about the same width (e.g., in the x-direction in FIG. 6C) as a conductor 690, may be outside of array 600. As such, array 600 may be referred to as a "contactless" array, for example. Eliminating contacts in memory array 600, but for the self-aligned contacts, may allow for higher densities of memory cells in memory array 600.

Figure 7A:
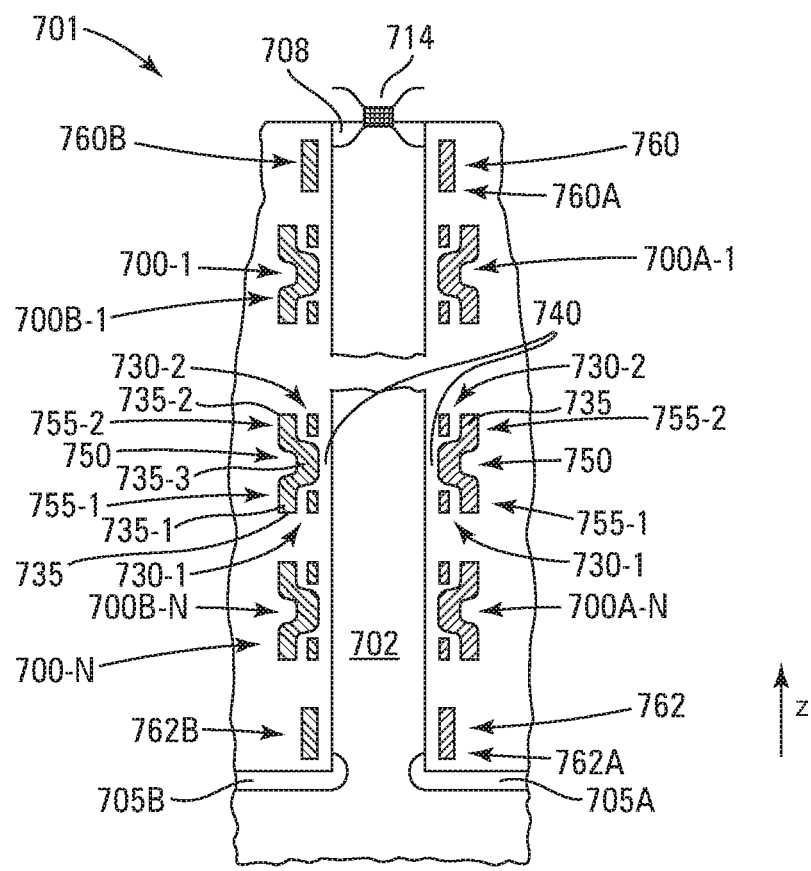
FIG. 7A is a cross-sectional view of a portion of a memory array in accordance with a number of embodiments of the present disclosure.

FIG. 7A is a cross-sectional view of a portion of a memory array 701 (e.g., that may be a portion of the memory array 106) in accordance with a number of embodiments of the present disclosure. For example, memory array 701 may include a vertical group (e.g., a string, such as a NAND string) of series-coupled memory cells 700-1 to 700-N. In some examples, a memory cell 700 (e.g., each of memory cells 700-1 to 700-N) may be a single (e.g., GAA) memory cell wrapped completely around a (e.g., vertical) semiconductor 702 (e.g., a vertical semiconductor pillar), such as single crystal p⁻ silicon. For example, semiconductor 702 may be a portion of a base semiconductor structure.

In some examples, semiconductor 702 may be similar to (e.g., the same as) semiconductor 302 (e.g., as described above in conjunction with and shown in FIG. 3), and a GAA memory cell 700 may be similar to (e.g., the same as) a memory cell 300 (e.g., as described above in conjunction with and shown in FIGS. 3 and 3A).

In other examples, a memory cell 700 may be any one of memory cells 700A-1 to 700A-N that may be wrapped around a portion of semiconductor 702 or any one of memory cells 700B-1 to 700B-N that may be wrapped around another portion of semiconductor 702. For example, memory cells 700A-1 to 700A-N may be a vertical group (e.g., string) of series-coupled memory cells wrapped around a portion of semiconductor 702, and memory cells 700B-1 to 700B-N may be another vertical group (e.g., a string) of series-coupled memory cells wrapped another portion of semiconductor 702, where the string memory cells 700A-1 to 700A-N may be electrically isolated from the string of memory cells 700B-1 to 700B-N. For example, a memory cell 700A of memory cells 700A-1 to 700A-N and a memory cell 700B of memory cells 700B-1 to 700B-N may be at the same vertical location may be wrapped around different portions of semiconductor 702 at the same vertical location on semiconductor 702. For example, memory cells 700A-1 to 700A-N and memory cells 700B-1 to 700B-N may be respectively at the same vertical locations along semiconductor 702. In some examples, a memory cell 700A may be similar to (e.g., the same as) a memory cell 300A (e.g., as described above in conjunction with and shown in FIGS. 3 and 3B), and a memory cell 700B may be similar to (e.g., the same as) a memory cell 300B (e.g., as described above in conjunction with and shown in FIGS. 3 and 3B).

Source/drains 705A and 705B (e.g., n⁺-type conductive regions) may be in semiconductor 702 and may be coupled to a source, for example. In examples, where there are single memory cells 700 (e.g., a single string of memory cells 700-1 to 700-N), source/drains 705A and 705B may operate as single source/drain 705 for that string, but in examples where there may be separate memory cells 700A and 700B (e.g., a string of memory cells 700A-1 to 700A-N separate from a string of memory cells 700B-1 to 700B-N), source/drains 705A and 705B may be separate and may be respectively for the string of memory cells 700A-1 to 700A-N and the string of memory cells 700B-1 to 700B-N. For example, source/drains 705A and 705B may be vertically below the strings of memory cells.

A source/drain 708 (e.g., an n⁺-type conductive region) may be in semiconductor 702. For example, source/drain 708 may be vertically above source/drains 705A and 705B. A data line 714 may be coupled to source/drain 708. In examples where there may be separate strings of memory cells 700A-1 to 700A-N and memory cells 700B-1 to 700B-N, source/drain 708 may be common to both strings. For example, source drain 708 may be vertically above the strings of memory cells.

During operation of the string of memory cells 700A-1 to 700A-N, for example, a vertical channel may be formed in semiconductor 702 between source/drain 705A and source/drain 708, where the channel may be adjacent (e.g., lateral) to the string of memory cells 700A-1 to 700A-N. During operation of the string of memory cells 700B-1 to 700B-N, for example, a vertical channel may be formed in semiconductor 702 between source/drain 705B and source/drain 708, where the channel may be adjacent (e.g., lateral) to the string of memory cells 700B-1 to 700B-N. In examples where there is a single string memory cells 700-1 to 700-N, a vertical channel may be formed semiconductor 702 between source/drain 708 and source/drains 705A and 705B.

A memory cell 700 (e.g., each of memory cells 700-1 to 700-N or each of memory cells 700A-1 to 700A-N and 700B-1 to 700B-N) may include a lower dielectric stack 730-1 to store charge and an upper dielectric stack 730-2 to store charge (e.g., where the upper dielectric stack 730-2 may be vertically above the lower dielectric stack 730-1). In some examples, for a single memory cell 700 (e.g., single string memory cells 700-1 to 700-N), each of dielectric stacks 730-1 and 730-2 may be a continuous structure completely around semiconductor 702, such as in a manner similar to (e.g., the same as that) shown for gate dielectric stack 330-2 in FIG. 3A. An upper dielectric stack 730-2 may be a dielectric stack that is closer source/drain 708, and thus data line 714, than lower dielectric stack 730-2.

In examples for separate memory cells 700A and 700B (e.g., a string of memory cells 700A-1 to 700A-N separate from a string of memory cells 700B-1 to 700B-N), each of the dielectric stacks 730-1 and 730-2 for a memory cell 700A (e.g., each of memory cells 700A-1 to 700A-N) may be around the portion of semiconductor 702 corresponding to memory cell 700A, and each of the dielectric stacks 730-1 and 730-2 for a memory cell 700B (e.g., each of memory cells 700B-1 to 700B-N) may be around the portion of semiconductor 702 corresponding to memory cell 700B, such as in a manner similar to (e.g., the same as that) shown for gate dielectric stack 330-2 in FIG. 3B. Note, for example, that the dielectric stacks 730-1 and 730-2 for a memory cell 700A may be electrically (e.g., and physically) isolated from the dielectric stacks 730-1 and 730-2 for a memory cell 700B.

A memory cell 700 (e.g., each of memory cells 700-1 to 700-N or each of memory cells 700A-1 to 700A-N and 700B-1 to 700B-N) may include a gate 735. In some examples, for a single memory cell 700, gate 735 may be a continuous structure completely around semiconductor 702, such as in a manner similar to (e.g., the same as that) shown for gate 335 in FIG. 3A. In examples for separate memory cells 700A and 700B, the gate 735 for a memory cell 700A (e.g., each of memory cells 700A-1 to 700A-N) may be around the portion of semiconductor 702 corresponding to memory cell 700A, and the gate 735 for a memory cell 700B (e.g., each of memory cells 700B-1 to 700B-N) may be around the portion of semiconductor 702 corresponding to memory cell 700B, such as in a manner similar to (e.g., the same as that) shown for the gate 335 in FIG. 3B. Note, for example, that the gate 735 for memory cell 700A may be electrically (e.g., and physically) isolated from the gate 735 for memory cell 700B.

In some examples, gate 735 may be of similar (e.g., the same) materials as gate 335 and dielectric stacks 730-1 and 730-2 may include similar (e.g., the same dielectrics) as dielectric stacks 330-1 and 330-2 or dielectric stacks 228-1 and 228-2 (FIG. 2A). A memory cell 700 (e.g., each of memory cells memory cells 700-1 to 700-N, memory cells 700A-1 to 700A-N, and memory cells 700B-1 to 700B-N) may include a non-volatile portion 755-1 that may include a portion (e.g., a control-gate portion) 735-1 of gate 735 and a dielectric stack 730-1 laterally between and coupled to (e.g., by direct physical contact with) semiconductor 702 and portion 735-1, a non-volatile portion 755-2 that may include a portion (e.g., a control-gate portion) 735-2 of gate 735 and a dielectric stack 730-2 laterally between and coupled to (e.g., by direct physical contact with) semiconductor 702 and portion 735-2, and a fixed-Vt (e.g., to within routine variations of the Vt) portion 750 that may include a portion (e.g., an access-gate portion) 735-3 of gate 735 and an interface dielectric 740 (e.g., similar to, e.g., the same as interface dielectric 340), such as tunnel dielectric, laterally between and coupled to (e.g., by direct physical contact with) semiconductor 702 and portion 735-3. The fixed-Vt portion 750 and the non-volatile portions 755-1 and 755-2, for example, may be coupled in series between a portion of a channel between a source/drain 708 and source/drains 705A and 705B when the fixed-Vt portion 750 and the non-volatile portions 755-1 and 755-2 are activated.

Portions 735-1, 735-2, and 735-3 may be contiguous and may form a continuous structure. Portion 735-3 may be vertically between portions 735-1 and 735-2 and vertically between dielectric stacks 730-1 and 730-2, for example.

In some examples (e.g., when there may be a single string of memory cells 700-1 to 700-N), a single (e.g., GAA) select transistor 760 that may be completely around semiconductor 702 may be vertically between and coupled in series with memory cell 700-1 and source/drain 708, and thus data line 714, and a single (e.g., GAA) select transistor 762 that may be completely around semiconductor 702 may be vertically between and coupled in series with memory cell 700-N and source/drains 705A and 705B, and thus a source. For example, select transistor 760 may be above memory cell 700-1, and thus the string, and select transistor 762 may be below memory cell 700-N, and thus the string. For example, select transistor 760 may be to selectively couple the string of memory cells 700-1 to 700-N to source/drain 708, and select transistor 762 may be to selectively couple the string of memory cells 700-1 to 700-N to source/drains 705A and 705B.

In other examples (e.g., when there may be a string of memory cells 700A-1 to 700A-N and separate string of memory cells 700B-1 to 700B-N), a select transistor 760A that may be around a portion of semiconductor 702 may be vertically between and coupled in series with memory cell 700A-1 and source/drain 708. A separate select transistor 760B (e.g., that may electrically isolated from select transistor 760A) that may be around another portion of semiconductor 702 may be vertically between and coupled in series with memory cell 700B-1 and source/drain 708, and thus data line 714. A select transistor 762A that may be around a portion of semiconductor 702 may be vertically between and coupled in series with memory cell 700A-N and source/drain 705A, and thus a source. A separate select transistor 762B (e.g., that may electrically isolated from select transistor 762A) that may be around another portion of semiconductor 702 may be vertically between and coupled in series with memory cell 700B-N and source/drain 705B.

For example, select transistor 760A may be to selectively couple the string of memory cells 700A-1 to 700A-N to source/drain 708; select transistor 762A may be to selectively couple the string of memory cells 700A-1 to 700A-N to source/drain 705A; select transistor 760B may be to selectively couple the string of memory cells 700B-1 to 700B-N to source/drain 708; and select transistor 762B may be to selectively couple the string of memory cells 700B-1 to 700B-N to source/drain 705B. In some examples, the single select transistor 760 may be to selectively couple either the string of memory cells 700A-1 to 700A-N or the string of memory cells 700B-1 to 700B-N to source/drain 708, and the single select transistor 762 may be to selectively couple either the string of memory cells 700A-1 to 700A-N or the string of memory cells 700B-1 to 700B-N to source/drains 705A and 705B.

Figure 7B:
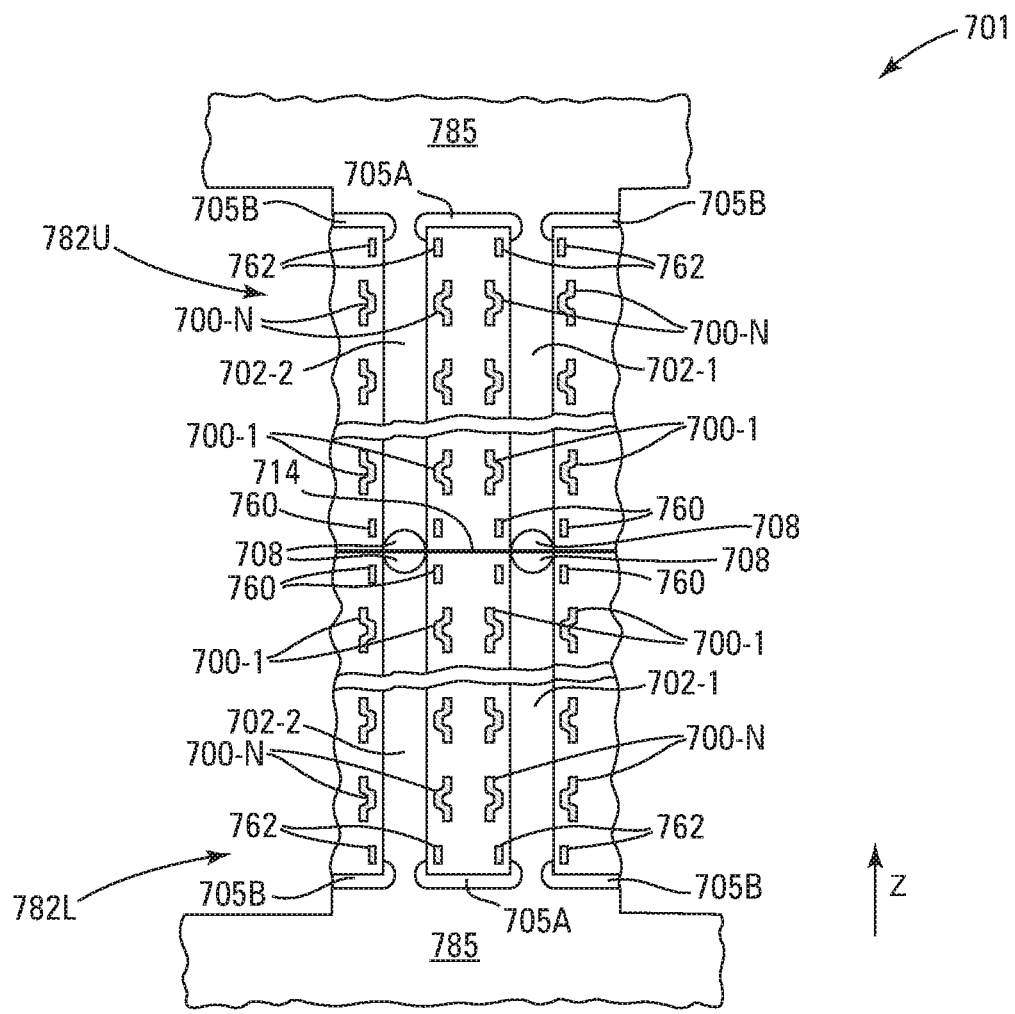
FIG. 7B is a cross-sectional view of a portion of a memory array in accordance with a number of embodiments of the present disclosure.

FIG. 7B is a cross-sectional view of a portion of memory array 701 in accordance with a number of embodiments of the present disclosure. Common reference numbers in FIGS. 7A and 7B may denote similar (e.g., the same) components in FIGS. 7A and 7B.

Memory array 701 may include a portion (e.g., an upper portion) 782U and a portion (e.g., a lower portion) 782L. For example, portions 782L and 782U may be inversions, such as inverted (e.g., mirror) images, of each other about a common data line 714. For example, portion 782U may be coupled (e.g., bonded) to portion 782L at data line 718. Portions 782L and 782U may each include semiconductors 785 (e.g., semiconductor base structures), such as single crystal p⁻ silicon. Portions 782L and 782U may each include vertical semiconductor portions (e.g., semiconductor pillars) 702-1 and 702-2 of a respective semiconductor 785. For example, semiconductor portion 702-1 of portion 782L and semiconductor portion 702-1 of portion 782U may be coupled at data line 714 and may be inversions of each other, and semiconductor portion 702-2 of portion 782L and semiconductor portion 702-2 of portion 782U may be bonded at data line 714 and may be inversions of each other. For example, data line 714 may be between and coupled to (e.g., by direct physical contact with) the semiconductor portions 702 of portions 782L and 782U.

Each of portions 782L and 782U may include a vertical group (e.g., a string) of the series-coupled memory cells 700-1 to 700-N adjacent to (e.g., wrapped completely around) each of semiconductor portions 702-1 and 702-2. For example, the series-coupled memory cells 700-1 to 700-N adjacent to the semiconductor portions 702-1 of portions 782L and 782U may be inversions of each other, and the series-coupled memory cells 700-1 to 700-N adjacent to the semiconductor portions 702-2 of portions 782L and 782U may be inversions of each other. For example, data line 714 may be between and common to (e.g., shared by) a string series-coupled memory cells 700-1 to 700-N in portion 782L and a string series-coupled memory cells 700-1 to 700-N in portion 782L.

The source/drains 705A and 705B may be in the semiconductor 785 in each of the portions 782L and 782U and may extend into the semiconductor portions 702-1 and 702-2 in each the portions 782L and 782U. A source/drain 708 may be in each of the semiconductor portions 702-1 and 702-2 in each of the portions 782L and 782U and may be coupled to data line 714.

The select transistors 760 and 762 may be in each of the portions 782L and 782U. For example, a select transistor 760 in portion 782L may be to selectively couple a string of series-coupled memory cells 700-1 to 700-N in portion 782L to a source/drain 708 in portion 782L, and thus data line 714, and a select transistor 760 in portion 782U may be to selectively couple a string of series-coupled memory cells 700-1 to 700-N in portion 782U to a source/drain 708 in portion 782U, and thus data line 714. Note that a source/drain 708 in semiconductor 702-1 in portion 782U is coupled to (e.g., by direct physical contact with) data line 714 and a source/drain 708 in semiconductor 702-1 in portion 782L is coupled to (e.g., by direct physical contact with) data line 714.

A select transistor 762 in portion 782L may be to selectively couple a string of series-coupled memory cells 700-1 to 700-N in portion 782L to source/drains 705A and 705B in portion 782L, and a select transistor 762 in portion 782U may be to selectively couple a string of series-coupled memory cells 700-1 to 700-N in portion 782U to source/drains 705A and 705B in portion 782U.

In some examples, separate, electrically isolated strings of memory cells, such as the separate, electrically isolated series-coupled memory cells 700A-1 to 700A-N and series-coupled memory cells 700B-1 to 700B-N discussed above in conjunction with FIG. 7A, may be adjacent to each of the semiconductor portions 702-1 and 702-2 in the portions 782L and 782U, where the separate, electrically isolated strings of memory cells in portion 782L may be inversions of the separate, electrically isolated strings of memory cells in portion 782L.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A memory array, comprising:
   a first group of series-coupled memory cells adjacent to a first semiconductor pillar, wherein memory cells of the first group of series-coupled memory cells wrap completely around the first semiconductor pillar;
   a second group of series-coupled memory cells adjacent to a second semiconductor pillar, wherein memory cells of the second group of series-coupled memory cells wrap completely around the second semiconductor pillar; and
   a data line between and coupled to the first semiconductor pillar and the second conductor pillar such that the first and the second semiconductor pillars extend in opposite directions from the data line;
   wherein a memory cell of the first group of series-coupled memory cells and a memory cell of the second group of series-coupled memory cells each comprise:
      a respective gate;
      a respective first dielectric stack between a first portion of the respective gate and the semiconductor pillar, wherein the respective first dielectric stack is wrapped completely around the semiconductor pillar and is to store a charge; and
      a respective second dielectric stack between a second portion of the respective gate and the semiconductor pillar, wherein a memory cell of the first group of series-coupled memory cells and a memory cell of the second group of series-coupled memory cells each comprise:
         a respective gate;
         a respective first dielectric stack between a first portion of the respective gate and
         a respective semiconductor pillar of the first and second semiconductor pillars,
         wherein the respective first dielectric stack is wrapped completely around the respective semiconductor pillar and is to store a charge; and
         a respective second dielectric stack between a second portion of the respective gate and the respective semiconductor pillar, wherein the second dielectric stack is to store a charge and is wrapped completely around the respective semiconductor pillar such that the respective second dielectric stack is separated from the respective first dielectric stack along the respective semiconductor pillar.

2. The memory array of claim 1, wherein the respective gate further comprises a respective third portion contiguous with the first portion of the respective gate and the second portion of the respective gate and that is between the respective first dielectric stack and the respective second dielectric stack.

3. The memory array of claim 1, further further comprising a respective interface dielectric between a third portion of the respective gate and the respective semiconductor pillar.

4. The memory array of claim 3, wherein the memory cell of the first group of series-coupled memory cells and the memory cell of the second group of series-coupled memory cells each comprise:
   a respective first non-volatile portion, comprising the first portion of the respective gate and the respective first dielectric stack;
   a respective fixed-threshold-voltage portion in series with the respective first non-volatile portion and comprising the third portion of the respective gate and the respective interface dielectric; and
   a respective second non-volatile portion in series with the respective fixed-threshold-voltage portion and comprising the second portion of the respective gate and the respective second dielectric stack.

5. The memory array of claim 1, wherein the first and second portions of the respective gate respectively wrap completely around the respective first dielectric stack and the respective second dielectric stack and are separated along the respective semiconductor pillar.

6. The memory array of claim 1, wherein the respective first dielectric stack and the respective second dielectric stack each comprise:
   a first storage dielectric;
   a tunnel dielectric adjacent to the first storage dielectric;
   a charge trap adjacent to the tunnel dielectric;
   a second storage dielectric adjacent to the charge trap; and
   a blocking dielectric adjacent to the second storage dielectric.

7. A memory array, comprising:
- a first group of series-coupled memory cells adjacent to a first semiconductor pillar, wherein memory cells of the first group of series-coupled memory cells wrap completely around the first semiconductor pillar;
- a second group of series-coupled memory cells adjacent to a second semiconductor pillar, wherein memory cells of the second group of series-coupled memory cells wrap completely around the second semiconductor pillar; and
- a data line between and coupled to the first semiconductor pillar and the second conductor pillar such that the first and the second semiconductor pillars extend in opposite directions from the data line.

8. The memory array of claim 7, wherein the data line is shared by the first group of series-coupled memory cells and the second group of series-coupled memory cells.

9. The memory array of claim 7, further comprising a first select transistor to selectively couple the first group of series-coupled memory cells to the data line and a second select transistor to selectively couple the second group of series-coupled memory cells to the data line.

10. The memory array of claim 7, wherein
a memory cell of the first group of series-coupled memory cells and a memory cell of the second group of series-coupled memory cells each comprise:
- a first dielectric stack to store a charge;
- a second dielectric stack to store a charge; and
- a single gate coupled to both the first and second dielectric stacks;

the first dielectric stack and the second dielectric stack of the memory cell of the first group of series-coupled memory cells are respectively located at different locations along the first semiconductor pillar; and the first dielectric stack and the second dielectric stack of the memory cell of the second group of series-coupled memory cells are respectively located at different locations along the second semiconductor pillar.

11. The memory array of claim 7, wherein the first group of series-coupled memory cells is a mirror image of the second group of series-coupled memory cells.

12. The memory array of claim 7, further comprising:
- a source/drain in the first semiconductor pillar in direct physical contact with the data line; and
- a source/drain in the second semiconductor pillar in direct physical contact with the data line.

13. The memory array of claim 7, wherein the data line is a bit line.

14. The memory array of claim 7, wherein the first semiconductor pillar is coupled to the second semiconductor pillar at the data line.

* * * * *